(12) United States Patent
Dalmia et al.

(10) Patent No.: US 12,315,853 B2
(45) Date of Patent: May 27, 2025

(54) SYSTEM PACKAGING FOR CELLULAR MODEM AND TRANSCEIVER SYSTEM OF HETEROGENEOUS STACKING

(71) Applicant: Apple Inc., Cupertino, CA (US)

(72) Inventors: Sidharth S. Dalmia, San Jose, CA (US); Kumar Nagarajan, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 459 days.

(21) Appl. No.: 17/582,870

(22) Filed: Jan. 24, 2022

(65) Prior Publication Data
US 2023/0238365 A1 Jul. 27, 2023

(51) Int. Cl.
| | |
|---|---|
| H01L 25/10 | (2006.01) |
| H01L 23/552 | (2006.01) |
| H01L 25/16 | (2023.01) |
| H01L 25/18 | (2023.01) |
| H04B 1/40 | (2015.01) |

(52) U.S. Cl.
CPC .......... *H01L 25/105* (2013.01); *H01L 23/552* (2013.01); *H01L 25/162* (2013.01); *H01L 25/18* (2013.01); *H04B 1/40* (2013.01); *H01L 2225/1035* (2013.01); *H01L 2225/1041* (2013.01); *H01L 2225/1058* (2013.01); *H01L 2225/1094* (2013.01)

(58) Field of Classification Search
None
See application file for complete search history.

(56) References Cited

U.S. PATENT DOCUMENTS

| | | | |
|---|---|---|---|
| 7,939,907 B2 * | 5/2011 | Osaka | H01L 25/18 257/691 |
| 2008/0122071 A1 * | 5/2008 | Tseng | H01L 21/568 438/122 |
| 2013/0053112 A1 | 2/2013 | Rofougaran et al. | |
| 2017/0084589 A1 * | 3/2017 | Kuo | H01L 23/3128 |
| 2019/0006318 A1 * | 1/2019 | Waidhas | H01L 25/50 |
| 2019/0148269 A1 * | 5/2019 | Cheah | H01L 21/76816 257/723 |
| 2020/0075501 A1 * | 3/2020 | Raorane | H01L 25/0657 |
| 2020/0091608 A1 | 3/2020 | Alpman et al. | |
| 2020/0161744 A1 | 5/2020 | Baks et al. | |
| 2020/0243462 A1 * | 7/2020 | Hsu | H01Q 1/02 |
| 2020/0279825 A1 | 9/2020 | Babcock et al. | |
| 2020/0303336 A1 * | 9/2020 | Otsubo | H05K 3/28 |
| 2020/0313306 A1 | 10/2020 | Kamgaing et al. | |
| 2021/0143525 A1 | 5/2021 | Kim et al. | |
| 2021/0313283 A1 | 10/2021 | Wilson et al. | |

* cited by examiner

*Primary Examiner* — Hung K Vu
(74) *Attorney, Agent, or Firm* — Fletcher Yoder, P.C.

(57) ABSTRACT

A radio frequency package includes a baseband processor, a transceiver, and a memory. The baseband processor performs processing for wireless communication functions. Moreover, the transceiver transmits and receives wireless signals based on the processing of the wireless communication functions. Additionally, the memory is associated with the baseband processor and stores instructions for performing the processing. The memory and the baseband processor are disposed on top of the transceiver.

20 Claims, 16 Drawing Sheets

SYSTEM PACKAGING FOR CELLULAR MODEM AND TRANSCEIVER SYSTEM OF HETEROGENEOUS STACKING

BACKGROUND

The present disclosure relates generally to wireless communication systems and devices and, more specifically, to system packaging that accommodates wireless communication components while conserving space.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, radio frequency devices may include a package, such as a system-in-package (SiP). A system-in-package incorporates substrates, dies, multiple integrated circuits, and/or passive devices into a single package. The system-in-package may have many components formed using semiconducting material, such as silicon. For example, the substrates and dies may include silicon on which the integrated circuits are fabricated. The substrates, dies, and devices may be coupled by wires bonded to the package or by solder joints (e.g., solder balls or pads). By way of example, the dies may be placed adjacent to each other on a single chip or substrate, as well be stacked on top of one another in the system-in-package.

The radio frequency devices may support communication over a broad range of frequencies, and a system-in-package of the radio frequency devices may include multiple chips to support wireless communications over the broad range of frequencies. By way of example, the system-in-package may include chips performing digital functions, as well as chips with analog circuits (e.g., little to no digital functions), on the same substrate. Moreover, the system-in-package may support a broad range of frequencies including frequencies used by multiple wireless carriers in various countries. Thus, to provide coverage over the broad range of frequencies or to add additional range coverage to the initial system-in-package, the system-in-package may include multiple chips and components. By way of example, the number of chips and components and/or the size of the chips may correlate to the range of frequencies supported for the wireless communications. Indeed, some of the chip sizes may be relatively large to support more frequencies. However, fitting these large chips in the system-in-package of the radio frequency devices may take up space and undesirably increase the size of the radio frequency devices.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a radio frequency package may include a baseband processor, a transceiver, and a memory. The baseband processor may perform processing for wireless communication functions. Moreover, the transceiver may transmit and receive wireless signals based on the processing of the wireless communication functions. Additionally, the memory is associated with the baseband processor and may store instructions for performing the processing, in which the memory and the baseband processor are disposed on top of the transceiver.

In another embodiment, a stacked system package includes a first layer, a second layer, a third layer, and a fourth layer. The first layer may be composed of multiple layers of interconnects including high density vias, using coreless, cored, or redistribution layers. The high density vias may include vias (e.g., redistribution layer vias) having a size of approximately 5 or more micrometers (μm) (e.g., between 5 to 10 μm). The second layer is disposed on top of the first layer and the second layer may include one or more transceivers that transmit and receive wireless signals. Additionally or alternatively, the second layer may include one or more power management units that control power to or manage power for various chips. The second layer may also include through mold vias that route signals, provide shielding, or both. The through mold vias may be composed of mold and/or other materials, such as epoxy, molding dielectrics, laminate, and the like. By way of example, the through mold vias may be completely or partially composed of copper, epoxy, and molding material. The through mold vias may include copper studs, solder covered copper spheres, and the like. Additionally, the third layer is disposed on top of the second layer. The third layer may include a baseband processor that processes radio frequency functions and a memory that stores instructions for performing the process. Furthermore, the fourth layer is disposed on top of the third layer and may include a thermal gel that dissipates heat.

In some embodiments, a top side of the transceivers in the second layer may be disposed facing down towards a main logic board of the radio frequency device or facing up towards the third layer with the baseband processor. The top side may refer to a side including transceiver circuitry, interconnections that connect the circuitry, or both. In some embodiments, the transceivers may include through silicon vias for high density interconnects (e.g., interconnects including high density vias of 5 or more μm) providing routing throughout the layers (e.g., the second layer) with the transceiver circuitry. In additional or alternative embodiments, the baseband processor may be disposed at the fourth layer or on top of the fourth layer in a fifth layer (e.g., top layer of the system package), for example, if the baseband processor is relatively too large to fit in the initial space of the third layer. As such, the large baseband processor may have more space for placement within the layer, as well as have at least one side that is exposed to components and materials external to the system package, such as mold. In such embodiments, the baseband processor may attach to components or materials that dissipate or transfer heat, such as a thermal heat sink, thermal gel, and the like. The top layer that includes electric components (e.g., the third layer) may also include one or more decoupling capacitors, bypass capacitors, or both, that may facilitate in maintaining power delivery above a threshold (e.g., maximum or approximately maximum power delivery provided by the radio frequency device). Furthermore, one or more integrated passive devices, magnetic components, or both, for radio frequency passive and digital passive functions may be disposed on top of, below, or between dies and/or packages of the radio frequency system package.

In yet another embodiment, a radio frequency package includes a baseband chip, a radio frequency chip, and a memory. The baseband chip performs processing for wireless communication functions. Moreover, the radio frequency chip transmits and receives wireless signals based on the processing of the wireless communication functions. Furthermore, the memory chip is associated with the baseband chip and stores instructions for performing the processing, in which the memory chip is disposed on top of the baseband chip.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
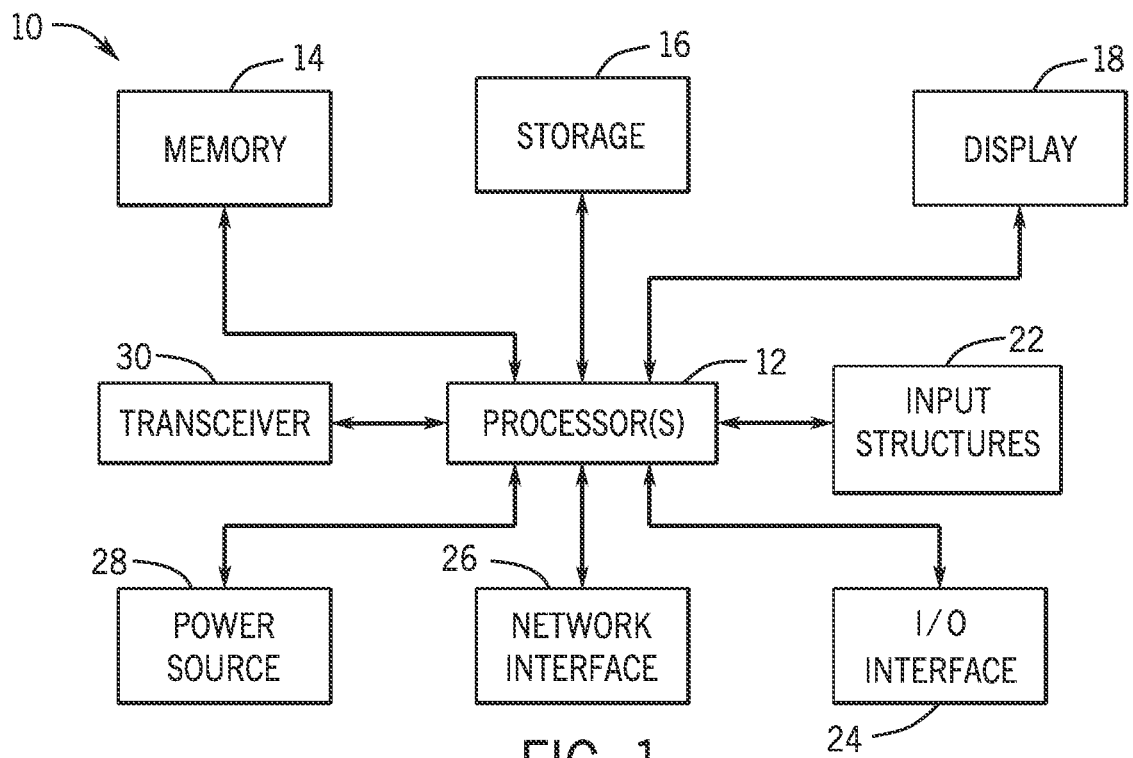
FIG. 1 is a block diagram of an electronic device, according to an embodiment of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment", "an embodiment", or "some embodiments" of the present disclosure are not intended to be interpreted as excluding the existence of additional embodiments that also incorporate the recited features. Use of the term "approximately" or "near" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on).

As previously mentioned, radio frequency devices may include multiple packages including a radio frequency system package (e.g., system-in-package). The radio frequency system package may include multiple chips, such as a baseband processor, a memory associated with the baseband processor, and one or more transceivers (e.g., one or more radio frequency chips), as well as power management units (PMUs). The baseband processor may perform processing of radio frequency functions for communicating wireless signals, such as transmission signals and reception signals. The memory (e.g., dynamic random access memory) may store instructions, data, or algorithms for the baseband processor to perform the processing. The transceiver may be controlled by the baseband processor to transmit the transmission signals and receive the reception signals. For example, the memory and the baseband processor primarily perform digital functions or processing while the transceiver primarily performs analog functions or includes analog circuits to communicate the wireless signals.

The size of the transceiver chip may generally correspond to the range of frequencies supported for wireless communications. For example, that size of the transceiver may be relatively larger to support a broad range of frequencies than the size of a transceiver supporting a narrow range of frequencies. Moreover, the transceiver size may correspond to the number of cellular carriers supported, as well as the range of frequencies supported for multiple countries so that the same radio frequency devices may be used across many countries. For example, the size of the transceiver may be relatively larger to support multiple carriers and/or communication over frequencies in multiple countries than the size of a transceiver supporting few carriers and/or a few frequencies for a particular country (e.g., only the United States).

Often, the baseband processor, the memory associated with the baseband processor, and the transceiver may be placed on the same substrate within the radio frequency system package. However, the area of the substrate may not increase to support the large transceiver. Moreover, since the transceiver includes primarily analog circuits, reducing the size of the transceiver may be difficult while supporting the broad range of frequencies. On the other hand, the baseband processor may be reduced in size even with increasing functionality (e.g., may be relatively more scalable). Furthermore, analog circuits of the transceiver may be more susceptible to noise from other components within the radio frequency system package (e.g., digital or switching noise generated by the baseband processor).

As such, the present disclosure provides techniques for packaging that accommodates wireless communication over a broad range of frequencies while conserving space in the packaging. In particular, the radio frequency system package includes a three-dimensional (3D) structure in which the baseband processor and the memory are stacked on top of the transceiver. In this manner, the transceiver may fit on the substrate, as well as add free space on the substrate for additional components and/or packages. Moreover, since the baseband processor performs primarily digital processing, the baseband processor may generate digital noise (e.g., switching noise). The digital noise may impact the transceiver (e.g., analog circuits of the transceiver) and cause signal degradation for the wireless communications. As such, the transceiver may be placed beneath the baseband processor in the stacked packaging (e.g., baseband processor at a top floor of the package and the receiver at a bottom floor). In some embodiments, memory may be placed on top of the baseband processor so that the stacked packaging includes the baseband processor on top of the transceiver, and the memory on top of the baseband processor.

Additionally, by placing the baseband processor on the top floor of the packaging, the baseband processor may consume more power and generate heat. The radio frequency system package described herein may include thermal gels, exposed dies (e.g., exposed top side of the baseband processor), and/or dummy dies to absorb or dissipate the heat. The radio frequency system may also include through mold vias that may include materials for providing shielding. The through mold vias may also route signals, as well as dissipate heat. Moreover, the radio frequency system package may include wire bonds that provide interconnections between components within the package, as well as provide shielding. Similarly, the radio frequency system package may include a shielding barrier of shielding layers (e.g., redistribution layers) that provide shielding, as well as route signals. In some embodiments, the radio frequency system package may include decoupling capacitors (e.g., a network of decoupling capacitors) to decouple noise from components (e.g., reduce or remove switching noise from the baseband processor). In this manner, the radio frequency system package described herein supports wireless communications over a broad range of frequencies while conserving space, manages thermal dissipation, ensures signal integrity, and provides noise immunity by shielding.

Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, a power source 28, and a transceiver 30. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
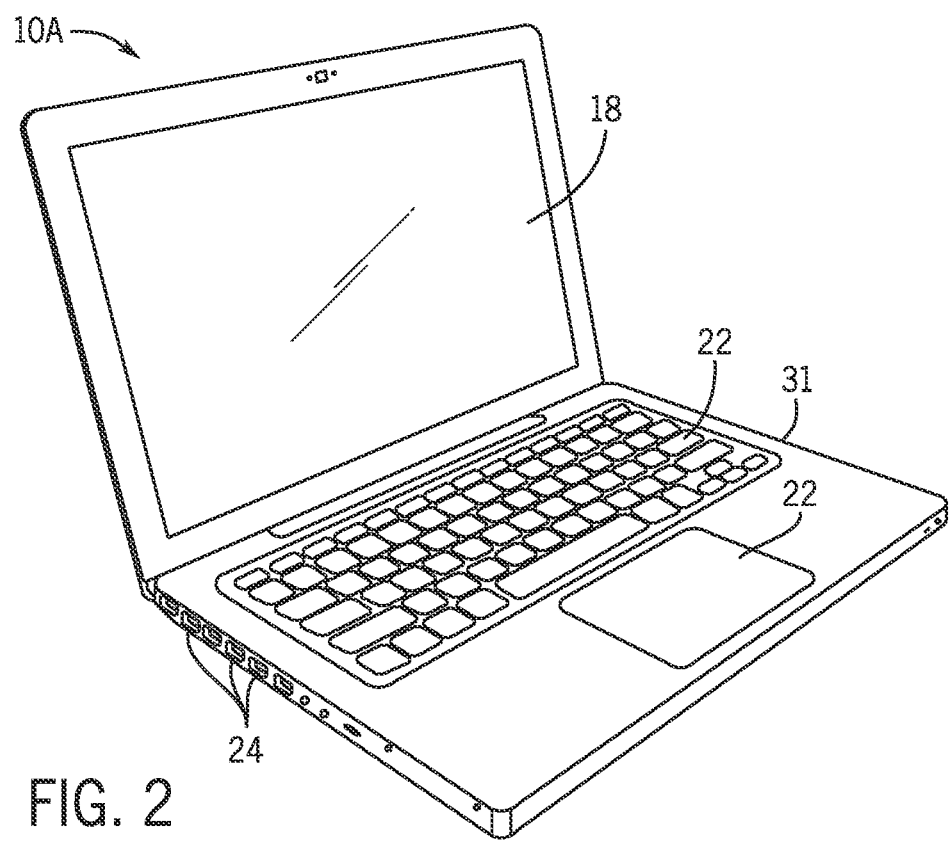
FIG. 2 is a perspective view of a notebook computer representing an embodiment of the electronic device of FIG. 1.
Figure 4:
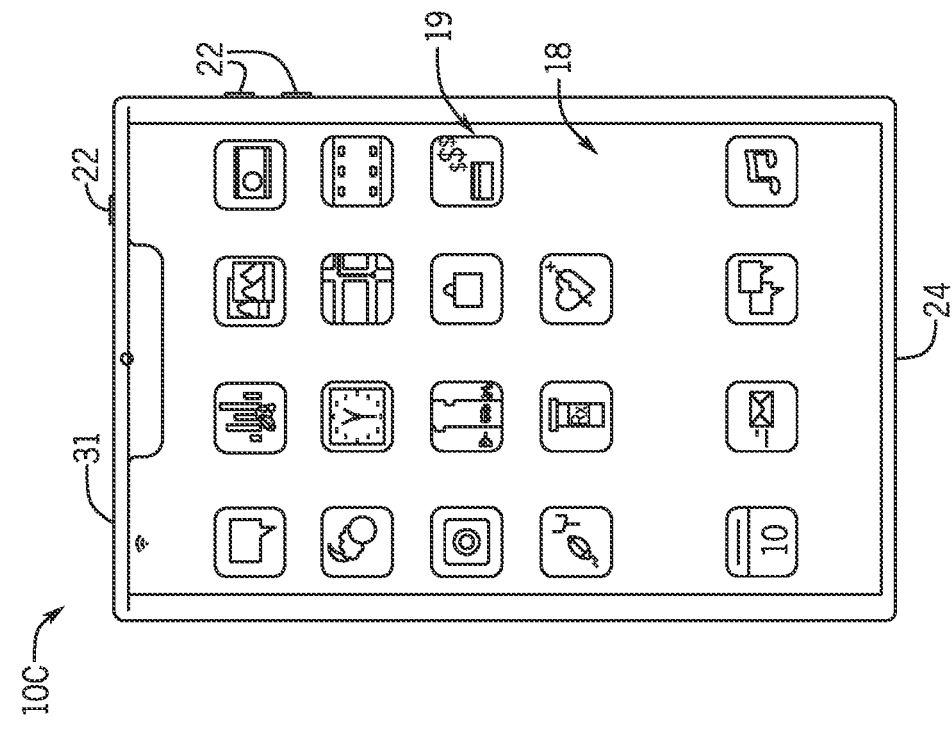
FIG. 4 is a front view of another handheld device representing another embodiment of the electronic device of FIG. 1.
Figure 3:
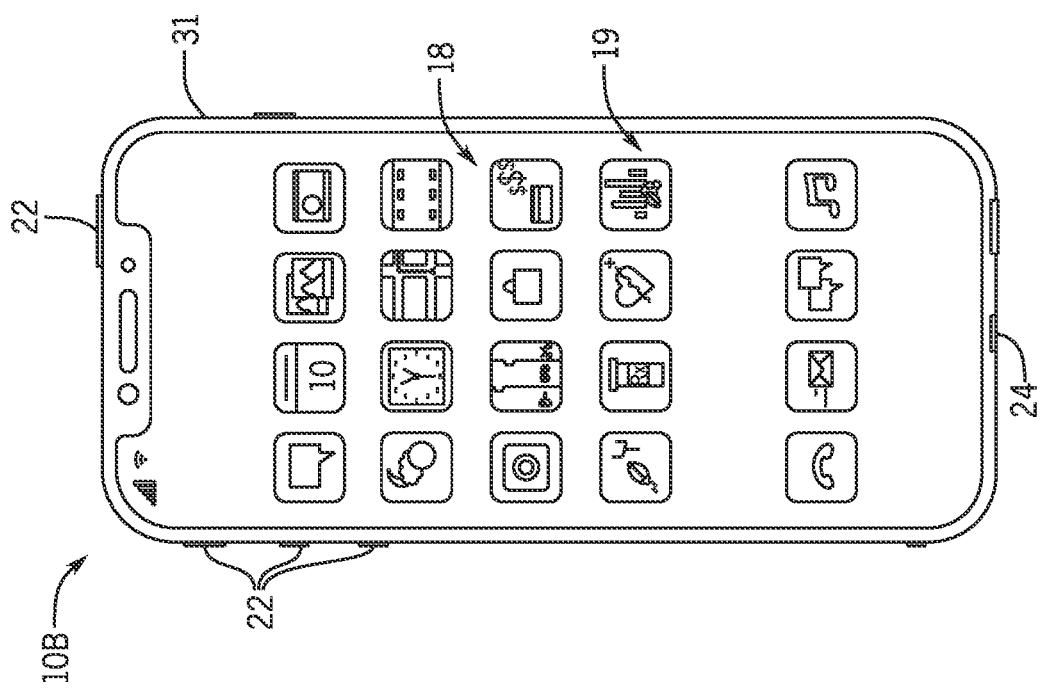
FIG. 3 is a front view of a handheld device representing another embodiment of the electronic device of FIG. 1.
Figure 5:
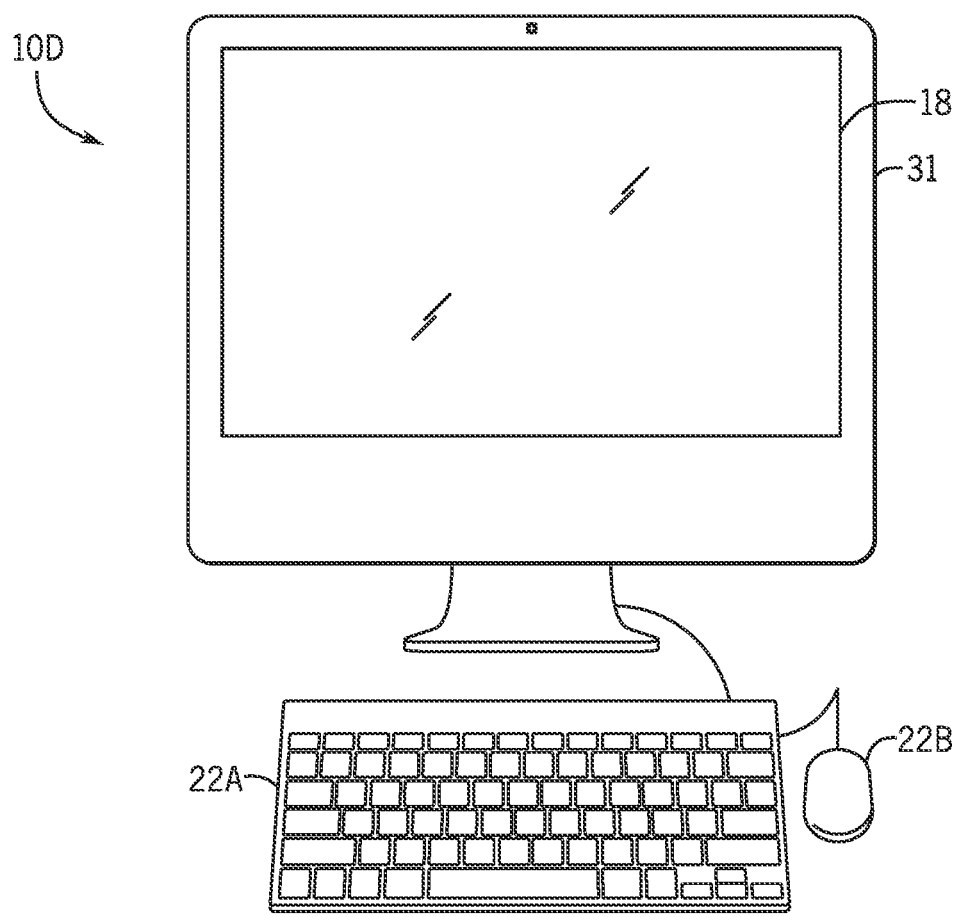
FIG. 5 is a front view of a desktop computer representing another embodiment of the electronic device of FIG. 1.
Figure 6:
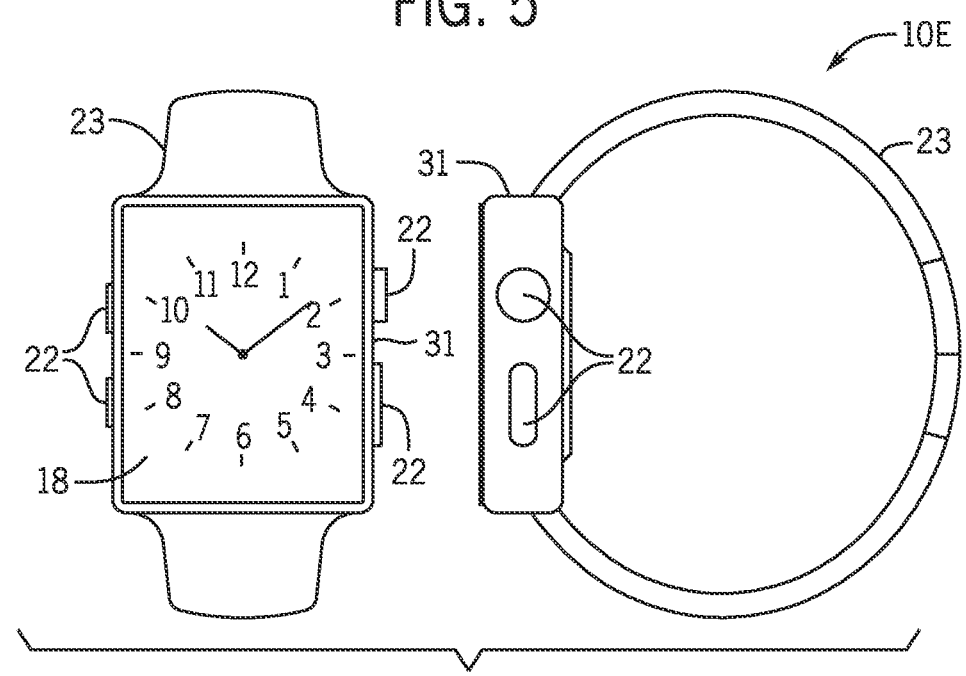
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, hardware, or any combination thereof. Furthermore, the processor(s) 12 and other related items in FIG. 1 may be a single contained processing module or may be incorporated wholly or partially within any of the other elements within the electronic device 10.

In the electronic device 10 of FIG. 1, the processor(s) 12 may be operably coupled with a memory 14 and a nonvolatile storage 16 to perform various algorithms or instructions. For example, algorithms for dynamically selecting a range of frequencies for particular wireless communications may be saved in the memory 14 and/or nonvolatile storage 16. The selection of the range of frequencies may be based on the bandwidth for particular applications executing on the electronic device 10, the type of wireless communication (e.g., Bluetooth, global positioning system (GPS), Wi-Fi, and so forth), the country in which the electronic device 10 is being used (e.g., United States, United Kingdom, Japan, etc.), and so forth. Such algorithms or instructions executed by the processor(s) 12 may be stored in any suitable article of manufacture that includes one or more tangible, computer-readable media. The tangible, computer-readable media may include the memory 14 and/or the nonvolatile storage 16, individually or collectively, to store the algorithms or instructions. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may display images generated on the electronic device 10. In some embodiments, the display 18 may include a touch screen, which may facilitate user interaction with a user interface of the electronic device 10. Furthermore, it should be appreciated that, in some embodiments, the display 18 may include one or more light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable the electronic device 10 to interface with various other electronic devices, as may the network interface 26. The network interface 26 may include, for example, one or more interfaces for a personal area network (PAN), such as a BLUETOOTH® network, for a local area network (LAN) or wireless local area network (WLAN), such as an 802.11x WI-FI® network, and/or for a wide area network (WAN), such as a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, 5th generation (5G) cellular network, and/or New Radio (NR) cellular network. In particular, the network interface 26 may include, for example, one or more interfaces for using a Release-15 cellular communication standard of the 5G specifications that include the millimeter wave (mmWave) frequency range (e.g., 30-300 GHz). The transceiver 30 of the electronic device 10, which includes the transmitter and the receiver, may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

In some embodiments, the electronic device 10 communicates over the aforementioned wireless networks (e.g., WI-FT®, WIMAX®, mobile WIMAX®, 4G, LTE®, 5G, and so forth) using the transceiver 30. The transceiver 30 may include circuitry useful in both wirelessly receiving the reception signals at the receiver and wirelessly transmitting the transmission signals from the transmitter (e.g., data signals, wireless data signals, wireless carrier signals, radio frequency signals). Indeed, in some embodiments, the transceiver 30 may include the transmitter and the receiver combined into a single unit, or, in other embodiments, the transceiver 30 may include the transmitter separate from the receiver. The transceiver 30 may transmit and receive radio frequency signals to support voice and/or data communication in wireless applications such as, for example, PAN networks (e.g., BLUETOOTH®), WLAN networks (e.g., 802.11x WI-FTC)), WAN networks (e.g., 3G, 4G, 5G, NR, and LTE® and LTE-LAA cellular networks), WIMAX® networks, mobile WIMAX® networks, ADSL and VDSL networks, DVB-T® and DVB-H® networks, UWB networks, and so forth. As further illustrated, the electronic device 10 may include the power source 28. The power source 28 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may be generally portable (such as laptop, notebook, and tablet computers), or generally used in one place (such as desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. of Cupertino, California. By way of example, the electronic device 10, taking the form of a notebook computer 10A, is illustrated in FIG. 2 in accordance with one embodiment of the present disclosure. The depicted notebook computer 10A may include a housing or enclosure 31, a display 18, input structures 22, and ports of an I/O interface 24. In one embodiment, the input structures 22 (such as a keyboard and/or touchpad) may be used to interact with the computer 10A, such as to start, control, or operate a graphical user interface (GUI) and/or applications running on computer 10A. For example, a keyboard and/or touchpad may allow a user to navigate a user interface and/or an application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPhone® available from Apple Inc. of Cupertino, California. The handheld device 10B may include an enclosure 31 to protect interior components from physical damage and/or to shield them from electromagnetic interference. The enclosure 31 may surround the display 18, which displays an array of icons 19. By way of example, when an icon 19 is selected either by an input structure 22 or a touch sensing component of the electronic display 18, an application program may launch. The I/O interfaces 24 may open through the enclosure 31 and may include, for example, an I/O port for a hardwired connection for charging and/or content manipulation using a standard connector and protocol, such as the Lightning connector provided by Apple Inc. of Cupertino, California, a universal serial bus (USB), or other similar connector and protocol. The I/O interfaces 24 may be associated with wiring and connectors within the radio frequency packaging of the electronic device 10.

The input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone that may obtain a user's voice for various voice-related features, and a speaker that may enable audio playback and/or certain phone capabilities. The input structures 22 may also include a headphone input that may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, California.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a Mac- Book®, or other similar device by Apple Inc. of Cupertino, California. It should be noted that the computer 10D may also represent a personal computer (PC) by another manufacturer. A similar enclosure 31 may be provided to protect and enclose internal components of the computer 10D, such as the display 18. In certain embodiments, a user of the computer 10D may interact with the computer 10D using various peripheral input structures 22, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 23, may be an Apple Watch® by Apple Inc. of Cupertino, California. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, LED display, OLED display, active-matrix organic light emitting diode (AMOLED) display, and so forth), as well as input structures 22, which may allow users to interact with a user interface of the wearable electronic device 10E.

Figure 7:
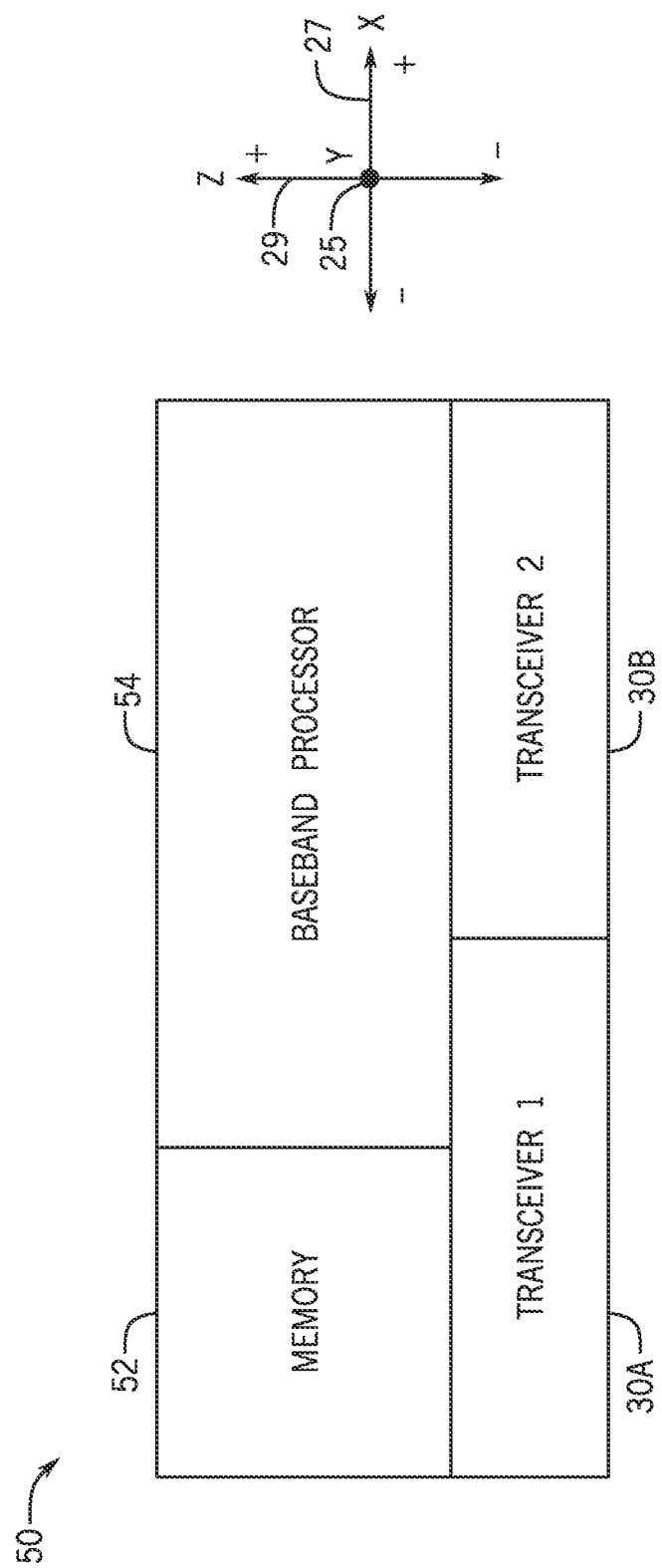
FIG. 7 is a schematic diagram of a radio frequency system package of the electronic device of FIG. 1, according to embodiments of the present disclosure.

With the foregoing in mind, FIG. 7 is schematic diagram of a radio frequency system package 50 of the electronic device 10 of FIG. 1. Although the depicted embodiment shows a three-dimensional (3D) stack of chips, which represents a particular embodiment, the radio frequency system package 50 may include one or more of the chips positioned in a different stack structure (e.g., two-dimensional (2D) or 2.5D). For example, one or more of the chips may positioned on top, beneath, and/or adjacent to another one of the one or more chips, for example, along a z-axis 29 (e.g., height), an x-axis 27(e.g., width), and/or a y-axis 25 (e.g., length) in a 3D space.

In the depicted embodiment, the radio frequency system package 50 includes multiple chips, such as a first transceiver 30A (Transceiver 1), a second transceiver 30B (Transceiver 2), a memory 52, and a baseband processor 54 (e.g., cellular modem). The chips may couple to (e.g., directly or indirectly connected) to a printed circuit board (PCB) substrate (not shown) (e.g., a main logic board). Although the following descriptions describe the radio frequency system package 50 with two transceivers 30, which represents a particular embodiment, the radio frequency system package 50 described herein may additionally or alternatively include one or more transceivers 30. The transceivers 30 may couple to an antenna array that includes multiple antennas that transmit and/or receive wireless signals. The antenna array may form a directional beam using signals emitted by each of the antennas (e.g., beamforming). The first transceiver 30A and the second transceiver 30B may each provide the transceiver 30 functions described herein or the functions may be distributed between the first transceiver 30A and the second transceiver 30B. Moreover, a top side (e.g., a side that is disposed proximate the antennas of the radio frequency device, a non-silicon bulk side, a portion including circuits and/or interconnects, or any combination thereof) of the first transceiver 30A and the second transceiver 30B may be disposed as facing down towards a printed circuit board on which the radio frequency system package 50 is disposed, or facing up towards the baseband processor 54 to facilitate a high interconnect density between layers of the radio frequency system package 50. The package of the transceivers 30 may include dies with or without the through silicon vias, as previously discussed. The through silicon vias may provide increased interconnection density (e.g., a size of approximately 5 or more μm).

In general, the transceivers 30 may primarily include analog circuits and perform analog functions, such as performing frequency modulation to transmit and receive wireless signals. The analog functions may involve utilizing capacitors, inductors, and the like for analog functions. In some embodiments, the transceivers 30 may also perform some digital functions, such as but not limited to sending and receiving binary data. On the other hand, the baseband processor 54 may primarily perform digital functions related to processing data for the wireless communications. In some embodiments, the baseband processor 54 may couple to or be integrated with an application processor. The baseband processor 54 may communicate with the memory 52 and the transceivers 30 to carry out the wireless communications. For example, the transceivers 30 may receive data from one or more panels (e.g., printed circuit boards that include one or more packages, such as system-in-packages that include substrates, dies, modules, and/or components) that may correspond to a particular side or portion of the radio frequency device. The transceiver 30 may send the received data to the baseband processor 54 for processing.

The baseband processor 54 may include one or more microprocessors, one or more "general-purpose" microprocessors, one or more special-purpose microprocessors, and/or one or more application specific integrated circuits (ASICS), or some combination thereof. For example, the baseband processor 54 may include one or more reduced instruction set (RISC) processors. In some instances, the baseband processor 54 may perform processing (e.g., execute software programs and/or instructions) for specification functions, such as specific functions related to specific wireless communication. The specific functions may include receiving or generating wireless signals, selecting particular antennas for transmitting or receiving signals of the antenna array, selecting an amplification level to amplify transmission signals using a power management circuitry, determining gain of the wireless signals transmitted and/or received from a particular transmitter and/or receiver associated with a particular antenna of the antenna array, and so forth. In some instances, the baseband processor 54 may be integrated with the processor 12 and perform additional functions related to the wireless communications, such as functions related to the display 18, adjusting bandwidth consumption, and so forth.

The baseband processor 54 may communicate with the memory 52 for processing instructions to perform the functions related to wireless communications. The memory 52 may store information such as control software, configuration data, and so forth. The baseband processor 54 may include particular baseband firmware, such as a baseband operating system. In some embodiments, the baseband processor 54 may perform digital functions or mostly digital functions, such as converting digital data into radio frequency signals (and vice-versa) that can subsequently be transmitted from the transceivers 30 over a network.

The memory 52 may include a tangible, non-transitory, machine-readable-medium, such as a volatile memory (e.g., a random access memory (RAM)) and/or a nonvolatile memory (e.g., a read-only memory (ROM)), flash memory, a hard drive, or any other suitable optical, magnetic, or solid-state storage medium, or a combination thereof. In some embodiments, the memory 52 may be static random access memory (SRAM) or dynamic random access memory (DRAM). The memory may store a variety of information and may be used for various purposes. For example, the memory device may store machine-readable and/or processor-executable instructions (e.g., in the form of software or a computer program) for the baseband processors 54 to execute, such as instructions for processing received data and transmitting or receiving signals at the transceivers 30.

A transceiver 30, as previously discussed with respect to FIG. 1, is a device that includes a transmitter and a receiver in a single package, and may transmit and receive data via wireless signals communicated on particular radio frequency using the antennas of the antenna array. Specifically, the transceivers 30 may each include a transmitter and a receiver that include components that facilitate transmission and reception of wireless signals, such as those sent and received between electronic devices 10 using mmWave communication technology or any other suitable communication protocol. By way of example, when communicating on the mmWave frequencies, an electronic device 10 may utilize beamforming techniques to form the directional beam, as previously mentioned. The transmitters of the transceivers 30 may include one or more phase shifters, transmitter power detectors, and power amplifiers. The transmitter phase shifters may modulate (e.g., phase-shift) transmission signals (e.g., wireless signals transmitted from antennas of the antenna array) and may form a beam that may be steered in a particular direction (e.g., the directional beam), such as towards another electronic device (e.g., an electronic device 10, a base station). The power amplifiers may amplify power level of transmission signals. Specifically, the power amplifiers may be supplied with a power amplifier supply voltage to control the amount of amplification provided by the power amplifiers (e.g., increase or decrease amplification, which may affect the antenna gain at the corresponding antennas). The transmitter power detectors may measure power of the transmission signals sent from the antennas of the antenna array. In some embodiments, the transceivers 30 may receive digital data signals from the baseband processor 54 and convert the digital data signals from a baseband protocol to analog signals, which may be modulated to phase-shift keying signals (e.g., quadriphase-shift keying (QPSK)), pulse-amplitude modulation (PAM) signals, quadrature amplitude modulation (QAM) signals, binary phase shift keying (BPSK) signals, to 5G signals, 6G signals, and the like. In some instances, the transceiver 30 may upconvert signals and downconvert signals, such as down converting mmWave signals to intermediate frequencies (IF) signals.

The receivers of the transceivers 30 may include one or more receiver phase shifters, low noise amplifiers, and receiver power detectors. The receiver phase shifters and the receiver power detectors may function similarly to the transmitter phase shifters and the transmitter power detectors. The low noise amplifiers may amplify the power level of reception signals (e.g., wireless signals received at antennas of the antenna array). Additional components in the transmitter and/or the receiver may include, but are not limited to, filters, mixers, and/or attenuators.

As previously discussed, integrating multiple chips that may increase in size within the same particular area within a package may be difficult. Specifically, one or more chips may increase in size to fit additional circuitry or components to provide certain functionalities. However, the area allotted for the chips and/or associated chips may not increase (e.g., initial area for the radio frequency system package 50 before adding additional components and circuitry). For example, a designer may increase the size of the transceiver 30 chip to add additional functionalities, such as for compatibility to communicate over a broader range of frequencies. However, it may be desired that the area within the radio frequency system package 50 to place the transceiver 30 and associated chips not increase (e.g., maintain original dimensions or decreased dimensions). As such, the radio frequency system package 50 includes the memory 52 and the baseband processor 54 on top of the transceivers 30 rather than the memory 52 and/or the baseband processor 54 being placed adjacent to the transceivers 30 on the same substrate (e.g., same layer of printed circuit board). As will be described herein, the radio frequency system package 50 may efficiently accommodate the co-located chips (e.g., the memory 52, the baseband processor 54, and the transceivers 30) by stacking the chips while conserving space (e.g., along the x-axis 27 and/or the y-axis 25). By stacking the chips in a 3D structure, the area initially including the memory 52 and the baseband processor 54 in the 2D structure may become available for larger transceivers 30 and/or other components for additional functionality. Another advantage of stacking chips is that the chip-to-chip communication may use relatively less power than other chip communication methods or standards, such as M-PHY, PCIe, USB, and the like. Thus, the stacked chip connections may also provide more power efficient communication. Although the following descriptions describe space conservation packaging techniques applied to a particular system package 50 related to the transceivers 30, the baseband processor 54, and the memory 52 associated with the baseband processor 54, the techniques may also apply to the other chips and/or packages (e.g., packages including multiple chips) of the electronic device 10.

Figure 8:
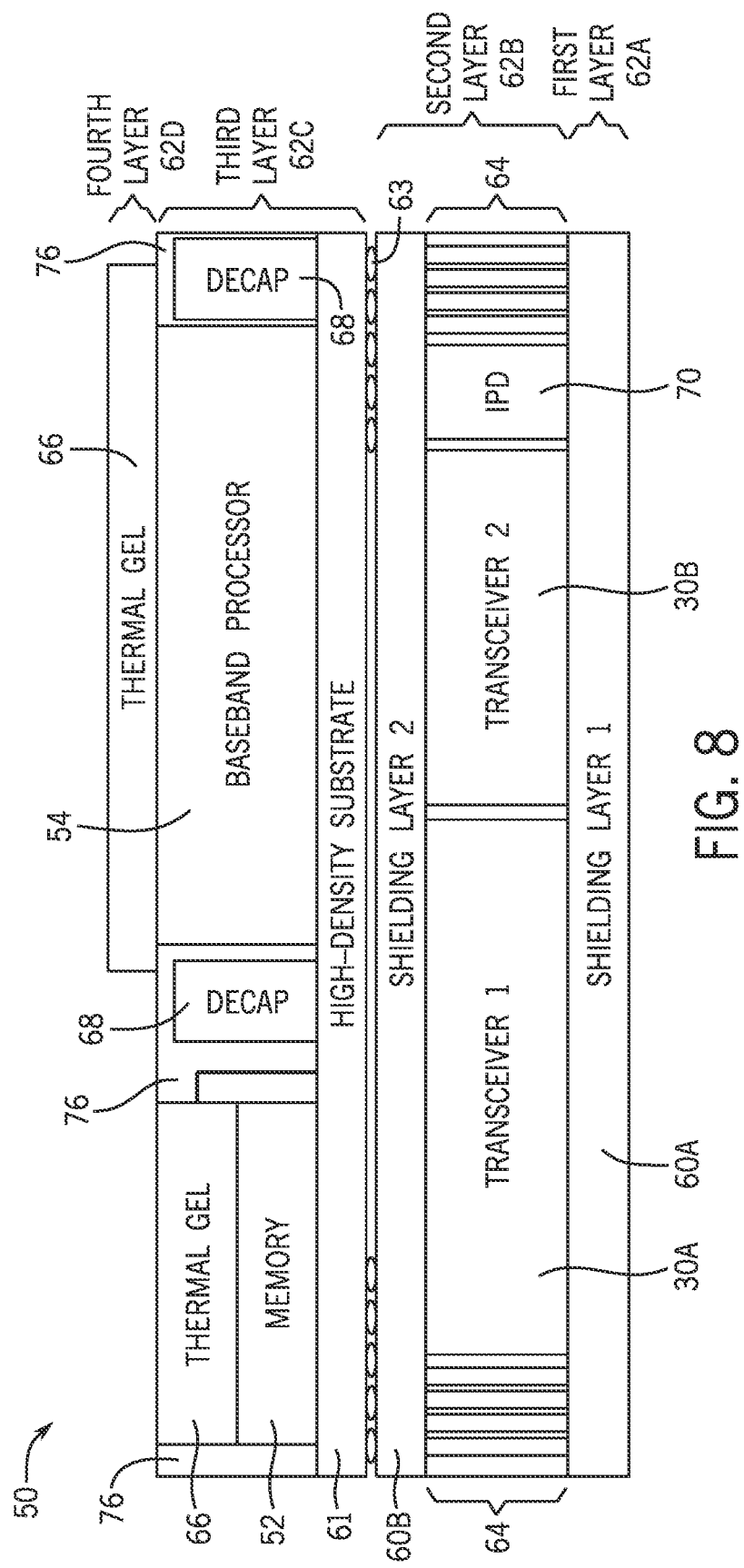
FIG. 8 is a schematic diagram of the radio frequency system package of FIG. 7 with a shielding barrier, according to embodiments of the present disclosure.

FIG. 8 is a schematic diagram of the radio frequency system package 50 of FIG. 7 with a shielding barrier. Although FIGS. 8-22 depict particular embodiments of the systems and methods described herein, and the following discussions describe the particular embodiments with respect to the corresponding figures, the features described for any one of the particular embodiment may additionally or alternatively apply to another embodiment. That is, a feature described in FIG. 8 may apply to the embodiment depicted and described for FIG. 9, FIG. 11, FIG. 21, and so forth. The radio frequency system package 50 may be described as having one or more layers in the 3D stacked structure, such as a first layer 62A, a second layer 62B, a third layer 62C, and a fourth layer 62D (e.g., each having one or more layers). The first layer 62A may include a first shielding layer 60A (Shielding Layer 1). The second layer 62B that is positioned on top of the first layer 62A may include one or more transceivers 30, such as the first transceiver 30A, the second transceiver 30B, one or more integrated passive devices 70 (IPDs), one or more through mold vias (TMVs) 64, and a second shielding layer 60B (Shielding Layer 2). Additionally or alternatively, the second layer 62B may include one or more power management units (not shown) that control power to or manage power for various chips. The third layer 62C that is positioned on top of the second layer 62B, may include a high-density substrate 61 (e.g., redistribution layer, coreless substrate of two or fewer layers, and the like), the memory 52, the baseband processor 54, a thermal gel 66, and one or more decoupling capacitors 68. In some embodiments, the high-density substrate 61 may include routing for power and/or logic. High-density substrate 61 may optionally include one or more structures embedded in the substrate material to facilitate power and/or logic routing, such as a communication bar or interface bar. In some embodiments, the baseband processor 54 and the memory 52 may be arranged within the third layer 62C laterally adjacent to one another. Moreover, and as shown, decoupling capacitors 58 may be disposed laterally adjacent to the baseband processor 54, the memory 52, or both. In additional or alternative embodiments, passive devices (e.g., integrated passive devices 70) may be disposed laterally adjacent to the baseband processor 54, the memory 52, or both, such as to provide decoupling, insulation from noise, and the like. In some embodiments, the memory 52 and the baseband processor 54 are encapsulated by mold 76 (e.g., mold compound) or another material to provide insulation, rigidity or other structural enhancements to the third layer 62C. In some embodiments, the mold 76 or other encapsulating material may be planarized and/or selectively removed after application to expose one or more sides of components in the third layer 62C, such as the top of the baseband processor 54. The fourth layer 62D that is positioned on top of the third layer 62C may include the thermal gel 66. In some embodiments, as shown in FIG. 8, the thermal gel 66 may be placed on an exposed surface of a component in the third layer 62C (e.g., top side of baseband processor 54). In some embodiments, some thermal gel 66 may be included in the third layer 62C (e.g., as shown on top of memory 52), and may be at least partially encapsulated in mold 76 or another encapsulating material.

The first shielding layer 60A and the second shielding layer 60B may form a shielding barrier between the transceivers 30 and the third layer 62C that includes the memory 52 and the baseband processor 54. As will be discussed herein, the first shielding layer 60A and the second shielding layer 60B may also provide high density routing (e.g., through vias). By way of example, the first layer 62A may be composed of multiple layers of interconnects including high density vias, such as through mold vias, using coreless, cored, or redistribution layers. The through mold vias may be composed of mold and/or other materials, such as metal. By way of example, the through mold vias may be completely or partially composed of copper. The through mold vias may include copper studs, solder covered copper spheres, and the like. In some embodiments, through mold vias may have a first diameter at one end of the length of a through mold via and a second diameter at the opposite end of the length of the through mold via. The first diameter of the through mold via may differ in size from the second diameter. In some embodiments, to minimize insertion loss, one or more through mold vias may be positioned to provide a path of relatively minimal distance between points of contact (e.g., pads, solder balls, pins). Generally, the chips, components, and/or layers with the chips and/or components of the radio frequency system package 50 may be coupled directly and/or indirectly by solder balls or pads 63, as shown. For example, the solder balls 63 may be disposed between components of the system package 50. The solder balls 63 may include solder (e.g., lead, tin, epoxy, low-melting alloy, and/or the like) that provides electrical connections between components to facilitate a communication path between the components. For example, the second layer 62B may couple to the third layer 62C via the solder balls 63.

The shielding layers 60 may include layers of metallic material that absorbs radio and electromagnetic waves. For example, the metallic material may include copper and the like. In some embodiments, the shielding layers may include one or more layers, such that they are redistribution layers (RDLs). The redistribution layers may include one or more metal layers (e.g., a copper metal layer) on top of one or more chips, such as the transceivers 30, to form and provide input/output (I/O) pads available for access to the chips via the pads. For example, the metal layers may form interconnects that electrically connect one part of the radio frequency system package 50 to another area of the radio frequency system package 50 or other packages of the electronic device 10 (e.g., mmWave package). As such, the shielding layers 60 may provide routing and/or shielding for the chips connected to the shielding layers 60. By way of example, the shielding layers 60 may provide routing and/or shielding for the transceiver 30, a high-density substrate 61, the memory 52 coupled to the high-density substrate 61, the baseband processor 54 coupled to the high-density substrate, and so forth). The high-density substrate 61 may include a substrate of one or more layers (e.g., one, three, four, and so forth) of insulating material (e.g., copper) that provides electrical insulation. The high-density substrate 61 may include an embedded trace substrate (ETS), an Ajinomoto build-up film (ABF), a redistribution layer (RDL), and the like. In some embodiments, the high-density substrate 61 may include one or more integrated passive devices 70 in the substrate for decoupling noise. That is, additionally or alternatively to the thermal gel 66, the integrated passive device 70 may be stacked to provide the decoupling. Moreover, in some instances, a thin film or trench capacitors may be placed under the memory 52 along the z-axis 29 to provide decoupling for the memory 52.

In some embodiments, the memory 52 may be grounded for additional shielding, such as by wire bonds 72 connecting the thermal gel 66 and/or the memory 52 to the high-density substrate 61. The wire bonds 72 may include one or more metal wires, (e.g., each wire diameter of approximately 10 to 15 micrometers (μm)) such as aluminum, copper, silver, gold, and the like metals, for providing interconnections between components. For example, the wire bonds 72 may make interconnections between a chip (e.g., integrated circuit) or other semiconductor device and its packaging, connect an integrated circuit to another electronic device, connect a printed circuit board to another, and so forth.

Moreover, the through mold vias 64 may provide shielding and routing for the chips of the radio frequency system package 50. Generally, vias are electrical connections between layers of a package so that signals may be routed between the layers of the package. For example, the vias may include holes that are drilled through two or more stacked layers and the holes are plated with metal (e.g., copper) that form the electrical connections through the insulation that separates the layers. Through mold vias 64 may create the interconnecting vias through mold caps. The through mold vias 64 may include insulating material, such as the copper, which may provide shielding. As such, the shielding provided from the shielding layers 60 and the through mold vias 64 surrounding the transceivers 30 may form a shielding enclosure around the transceivers 30 (e.g., a fence-like shield enclosure). The transceivers 30 may be generally sensitive to noise, and thus, this shielding enclosure may shield the transceivers 30 from external noise from other chips and components of the radio frequency system package 50. For example, the enclosure may shield the transceivers 30 from digital noise from the baseband processor 54 that may otherwise negatively impact radio frequency communications from the transceiver 30 (e.g., decrease signal-to-noise ratio (SNR)). As such, the through mold vias 64 may provide both signal routing and shielding. In some embodiments, and as previously mentioned, a top side of the transceivers 30 in the second layer 62B (e.g., a side that includes the antennas) may be disposed facing down towards a main logic board of the radio frequency device or facing up towards the third layer 62C with the baseband processor 54. In some embodiments, the transceivers 30 may include through silicon vias (TSVs) for high density interconnects providing routing throughout the layers (e.g., the second layer 62B) with the transceiver circuitry.

In some instances, by placing the memory 52 and/or the baseband processor 54 on top of the transceivers 30 in the 3D radio frequency system package rather than adjacently, the memory 52 and/or the baseband processor 54 may consume more power than when placed adjacently to the transceivers 30 on the same layer (e.g., in 2D). Thus, the third layer 62C and the fourth layer 62D include the thermal gel 66 on top of the memory 52 and the baseband processor 54, respectively. The thermal gel 66 may facilitate heat dissipation such that heat from the memory 52 and the baseband processor 54 caused by the increased power consumption may dissipate through the thermal gel 66. Although the radio frequency system package 50 described herein uses the thermal gel 66 for heat dissipation, which is a particular embodiment, the radio frequency system package 50 may additionally or alternatively use exposed dies (e.g., exposing the top of the memory 52 (e.g., die) rather than placing the thermal gel 66 on top of the memory 52). Additionally or alternatively to the thermal gel 66, the radio frequency system package 50 may include dummy dies placed on top of or beneath (e.g., below) the memory 52 and/or the baseband processor 54. In some embodiments, as previously mentioned, the baseband processor 54 may be disposed on the fourth layer 62D or on top of the fourth layer 62D in a fifth layer (not shown) (e.g., top layer of the system package 50), for example, if the baseband processor 54 is relatively too large to fit in the initial space of the third layer 62C. As such, the large baseband processor 54 may have more space for placement within the layer, as well as have at least one side that is exposed to components and materials external to the radio frequency system package 50, such as mold. In such embodiments, the baseband processor 54 may attach to components or materials that dissipate or transfer heat, such as the thermal gel 66, a thermal heat sink, and the like.

Additionally or alternatively to the shielding barrier of the shielding layers 60, the decoupling capacitors 68 of the third layer 62C may include one or more capacitors that isolate or decouple one part of an electrical network from another, for example, to reduce noise. For example, noise caused by components may be shunted through the capacitor, reducing the effect it has on the radio frequency system package 50. Generally, the decoupling capacitors 68 may be placed as close as possible to the source of the signal being decoupled (e.g., within a threshold distance). Here, to decouple the memory 52 and the baseband processor 54 from the transceivers 30, the decoupling capacitors 68 may be placed next to, approximately next to, or adjacent to the memory 52 and the baseband processor 54. In this manner, the decoupling capacitors 68 may reduce or prevent noise caused by the memory 52 and/or the baseband processor 54 from negatively impacting the transceivers 30 (e.g., decreasing signal-to-noise ratio and decreasing signal integrity). Additionally or alternatively to the decoupling capacitors 68, the third layer 62C may include bypass capacitors. The decoupling capacitors 68, the bypass capacitors, or both, may facilitate in maintaining power delivery above a threshold (e.g., maximum or approximately maximum power delivery provided by the radio frequency device. In some embodiments, ferrite beads and integrated passive devices 70 (e.g., inductors) may be used to isolate noise (e.g., noise occurring over high frequencies) from the baseband processor 54 to a radio frequency integrated circuit of the radio frequency device.

Generally, integrated passive devices, magnetic components, or both, for radio frequency passive and digital passive functions, may be disposed on top of, below, or between dies and/or packages of the radio frequency system package 50. To illustrate, the radio frequency system package 50 in the depicted embodiment includes one or more integrated passive devices 70. Integrated passive devices 70 (e.g., integrated passive components and/or embedded passive components) include electronic components, such as one or more of resistors, capacitors, inductors, microstrip lines, impedance matching elements, baluns, filters, and the like. The one or more components are integrated into the same package or substrate (e.g., resistor-capacitor-inductor (RCL) network) to form a resistive silicon substrate. In some embodiments, the integrated passive devices 70 may be packed into a die or chip, or be stacked (e.g., on top of another die or chip) in 3D with active integrated circuits or other integrated passive devices 70. The integrated passive devices 70 may reduce power loss and enhance signal transmission. By coupling the transceivers 30 to the integrated passive devices 70 (e.g., here, the integrated passive device 70 is connected to the second transceiver 30B), signal loss from the transceivers 30 may be reduced.

Figure 9:
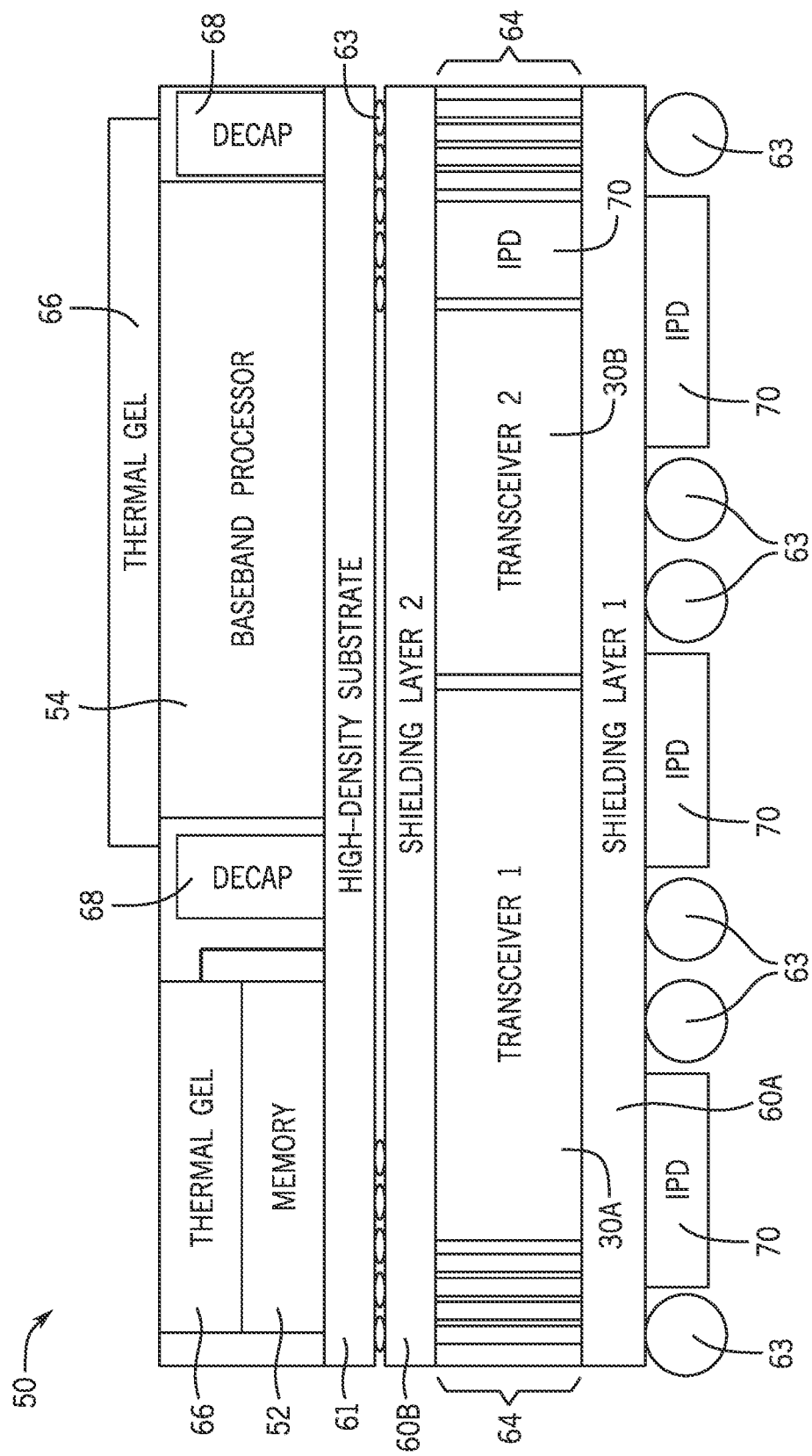
FIG. 9 is a schematic diagram of a radio frequency system package with integrated passive devices, according to embodiments of the present disclosure.

FIG. 9 is a schematic diagram of a radio frequency system package 50 with integrated passive devices 70 under the first shielding layer 60A. As shown, in some embodiments, the radio frequency system package 50 may also include integrated passive devices 70 positioned under the first shielding layer 60A to reduce power loss and enhance signal transmission from the transceivers 30. These integrated passive device 70 include components and function as previously described. By way of example, the integrated passive devices 70 may include capacitors that reduce digital noise from the baseband processor 54, such as digital noise or switching noise (e.g., noise from components used for performing digital functions by the baseband processor 54). For example, the switching noise caused by enabling wireless communications over varying frequencies (e.g., converting signals), and the noise may occur at a particular frequency. This noise may otherwise reduce radio frequency signal quality (e.g., decrease signal-to-noise ratio) from the transceivers 30.

The radio frequency system package 50 may also include additional solder balls 63. These solder balls 63 may couple the first shielding layer 60A to a printed circuit board (e.g., another die or chip, a main logic board, and the like). The integrated passive devices 70, such as the integrated passive devices 70 adjacent to the solder balls 63 under the first shielding layer 60A, may provide shielding from noise caused by components on the printed circuit board or coupled to the printed circuit board.

Figure 10:
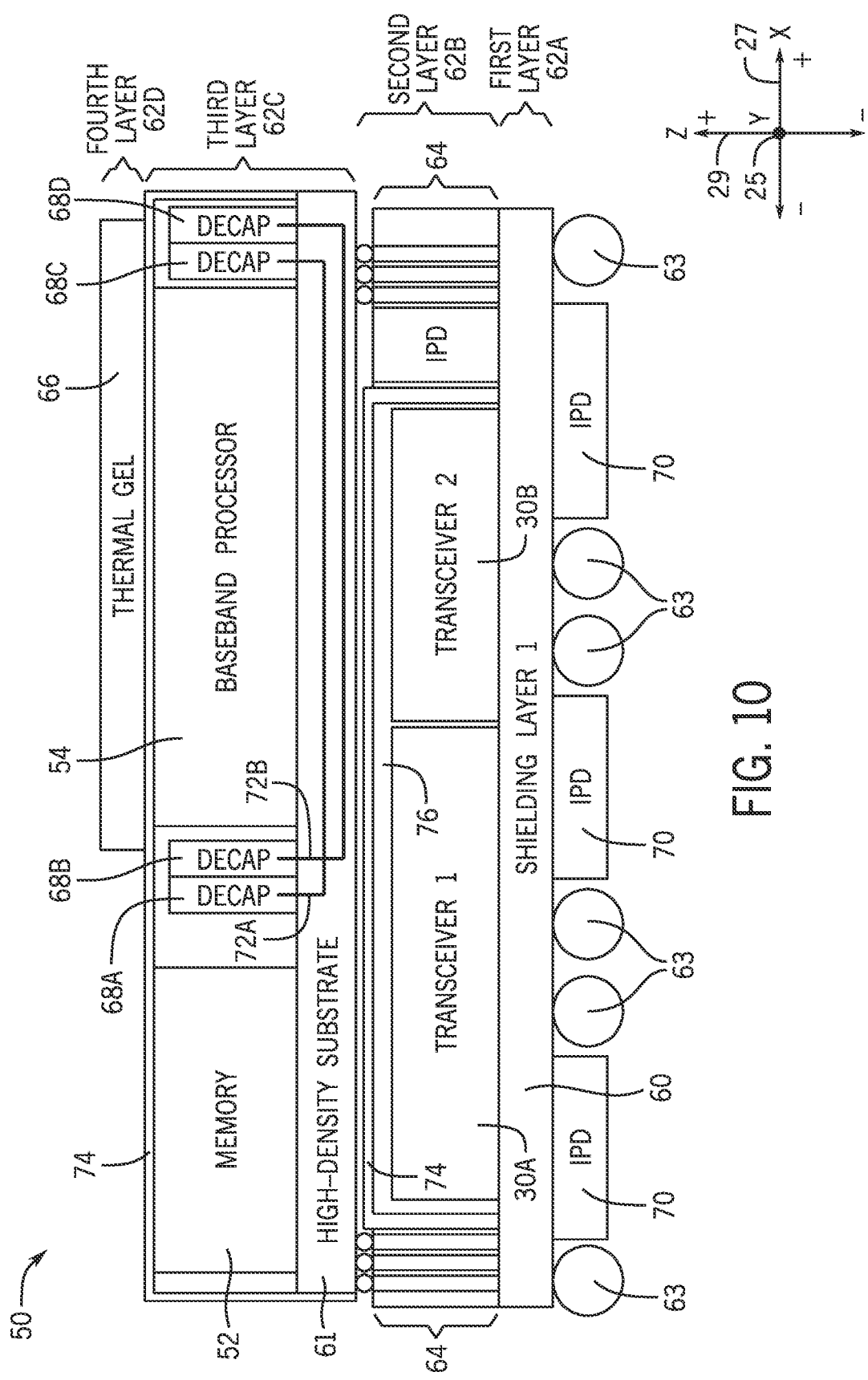
FIG. 10 is a schematic diagram of a radio frequency system package with a continuous trench shielding, according to embodiments of the present disclosure.

FIG. 10 is a schematic diagram of a radio frequency system package 50 with continuous shielding around chips. The radio frequency system package 50 also includes multiple decoupling capacitors 68 to form a decoupling network for filtering noise. In particular, a first decoupling capacitor 68A, a second decoupling capacitor 68B, a third decoupling capacitor 68C, and a fourth decoupling capacitor 68D form a decoupling capacitor network around the baseband processor 54 to decouple noise generated from the baseband processor 54. The decoupling capacitors 68 may be connected via one or more wire bonds 72. For example and as shown, the first decoupling capacitor 68A may connect to the third decoupling capacitor 68C via a first wire bond 72A.

The second decoupling capacitor 68B may connect to the fourth decoupling capacitor 68D via a second wire bond 72B. The wire bonds 72A and 72B may include one or more wires. The decoupling capacitors 68 connected by the wire bonds 72 around the baseband processor 54 may provide a local filtering (e.g., local to the transceiver 30 and/or the radio frequency system package 50. Although the depicted embodiment shows the decoupling capacitor network of the decoupling capacitors 68 around the baseband processor 54, which represents a particular embodiment, the radio frequency system package 50 may include multiple (e.g., two, four, six, and so forth) decoupling capacitors 68 around any components of the radio frequency system package 50 that may generate noise and adversely impact integrity of another component of the radio frequency system package 50 (e.g., signal integrity of signals from the transceivers 30).

To form the continuous shielding around chips, the radio frequency system package 50 includes trenches 74 around the chips. In some embodiments, the trenches 74 may be formed around mold 76 that encapsulates the chips while in additional or alternative embodiments, the trenches 74 may be formed directly around the chips. By way of example, although FIG. 10 depicts a trench 74 formed around a mold 76 that encapsulates transceivers 30, which represents a particular embodiment, the discussions described herein may also apply to a trench 74 formed directly around the transceivers 30. The trenches 74 may be filled with conformal shielding material, such as sputtered metal, metallic materials, paste materials, metal foam, and the like. The conformal shielding material may include copper, brass, nickel, silver, steel, tin, and the like metals. Additionally or alternatively, the trench may be filled with metal nano-ferrite composite fillers to provide isolation from noise (e.g., occurring at low MHz to high GHz frequencies). The trenches 74 are formed around the chips in a continuous manner or semi-continuous manner, such as without a break or approximately without a break, so that the shielding material fills the trenches 74 in a manner to provide continuous or approximately continuous electromagnetic shielding around the chips (e.g., continuous shielding or semi-continuous shielding). For example, the trenches 74 may be formed on each exposed side of a chip. If the sides of the chips are not exposed, the trench 74 may be formed at a point where the next closest side of the radio frequency system package 50 is exposed.

By way of example, a trench 74 may be formed on top of the baseband processor 54 and the memory 52, along the x-axis 27 and along the sides of the fourth layer 62D of the radio frequency system package 50 along the negative z-axis 29 (e.g., when the baseband processor 54 and the memory 52 are viewed as being at the center in the 3D space (0, 0, 0)). For example, the trench 74 may not formed along the sides of the baseband processor 54 along the negative z-axis 29 since the decoupling capacitors 68 are placed there, and thus, the sides are not exposed. On the other hand, the first transceiver 30A and the second transceiver 30B are placed next to each other, such that they may be connected (e.g., indirectly or directly coupled) and the outer sides of the transceivers 30 along the negative z-axis 29 are exposed. As such, a trench 74 may be formed around the exposed top side of the transceivers 30 along the x-axis 27 and the exposed outer sides of the transceivers 30 along the negative z-axis 29. The trenches 74 may not be formed at the bottom sides of the baseband processor 54, the memory 52, and the transceivers 30 since these chips are stacked in the radio frequency system package 50 and the bottom side is not exposed. In some embodiments, the trenches 74 may be formed on an exposed side of the chip based on a threshold space available between the side and a closest substrate or component to the side. Noise immunity and reduced interference may be achieved by forming the continuous shielding around the primarily digital processing chips, such as the baseband processor 54 and the associated memory 52, and around the primarily analog chips such as the transceivers 30. For example, noise from the shielded primarily digital processing chips and noise from the shielded primarily analog chips may not impact each other (e.g., reduced impact of noise).

The radio frequency system package 50 may also include the through mold vias 64 surrounded by mold 76. The through mold vias 64 and the network of decoupling capacitors 68 may facilitate providing an intended power voltage to the baseband processor 54. In particular, the through mold vias 64 may facilitate routing the power and reducing any current-resistor (IR) voltage drop before it reaches baseband processor 54. The through mold vias 64 may include shielded material (e.g., metal). Moreover, to ensure that the power to the baseband processor 54 is decoupled, the network of decoupling capacitors may filter the voltage before the voltage goes into the baseband processor 54. Additionally, the conformal shielding may reduce noise produced from the through mold vias 64 and/or that may otherwise travel to and impact the transceivers 30. In some embodiments, the transceivers 30 may be shielded by trenches 74, through mold vias 64, or both. For example, a semi-continuous shielding may include conformal shielding in a trench 74 along at least a first exposed side of the first transceiver 30A and at least one through mold via 64 along at least a second exposed side of the first transceiver 30A.

Figure 11:
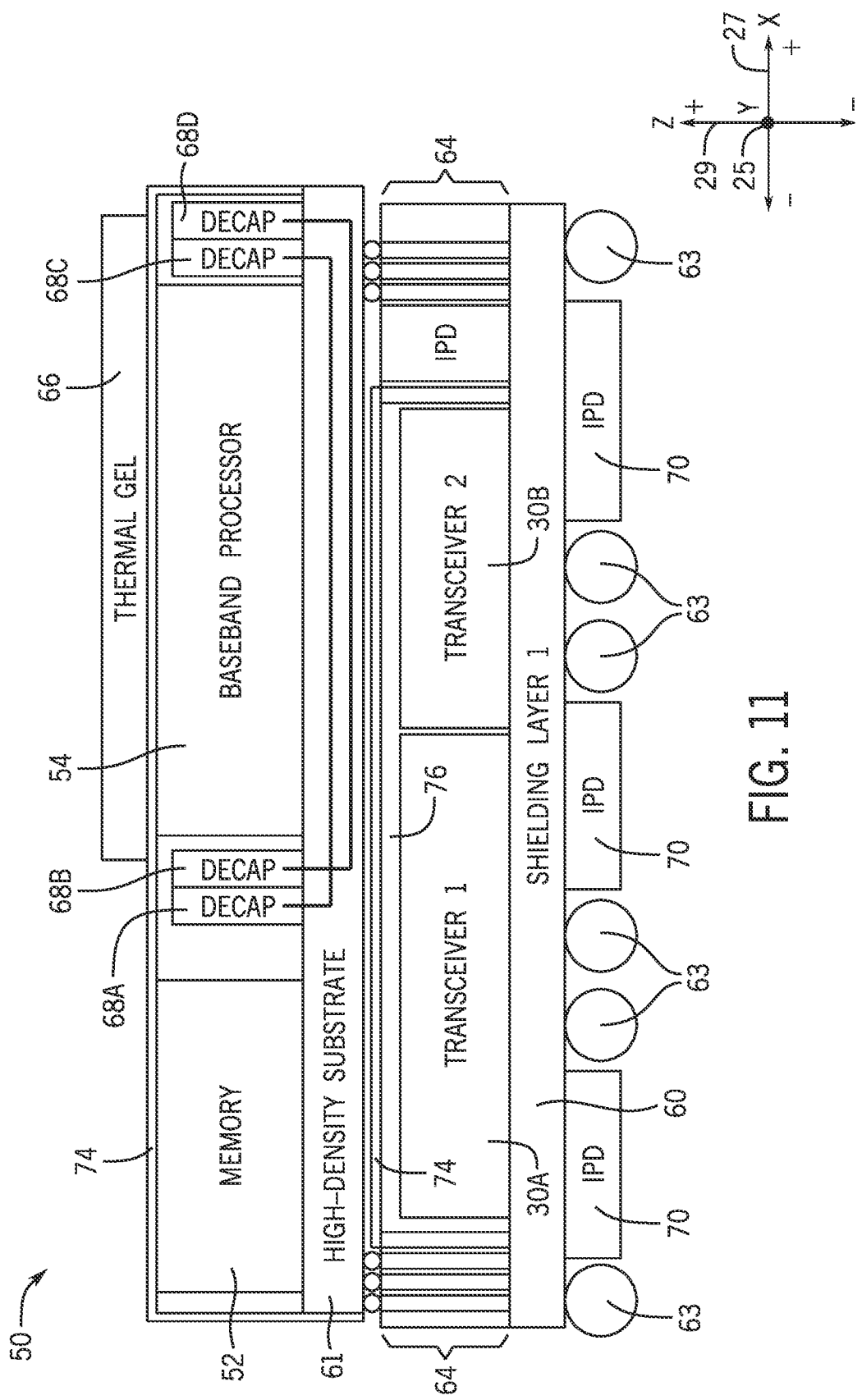
FIG. 11 is a schematic diagram of a radio frequency system package with the trench shielding and through mold vias, according to embodiments of the present disclosure.

In general, as voltage is provided in the radio frequency system package 50, such as vertically or laterally, components providing the voltage may generate noise. In some instances, the components may generate noise in various directions, functioning as an antenna radiating signals in the various direction. By way of example, when providing high power voltage signals that may switch in a switch-mode power supply, the switching voltage signals may result in switching power noise. As such, the decoupling capacitors 68 may filter out the noise before the baseband processor 54 receives the voltage. In some embodiments, the trenches 74 or a portion of the trenches 74 may be substituted by the through mold vias 64, as shown in FIG. 11. For example, rather than creating the continuous shielding around the chips using the trenches 74 filled with conformal shielding material, the shielding may include portions that include trenches 74 with the shielding material and/or the through mold vias 64 made of similar shielding materials and/or providing a similar shielding effect (e.g., similar shielding capabilities as the shielding materials in the trenches 74).

Figure 12:
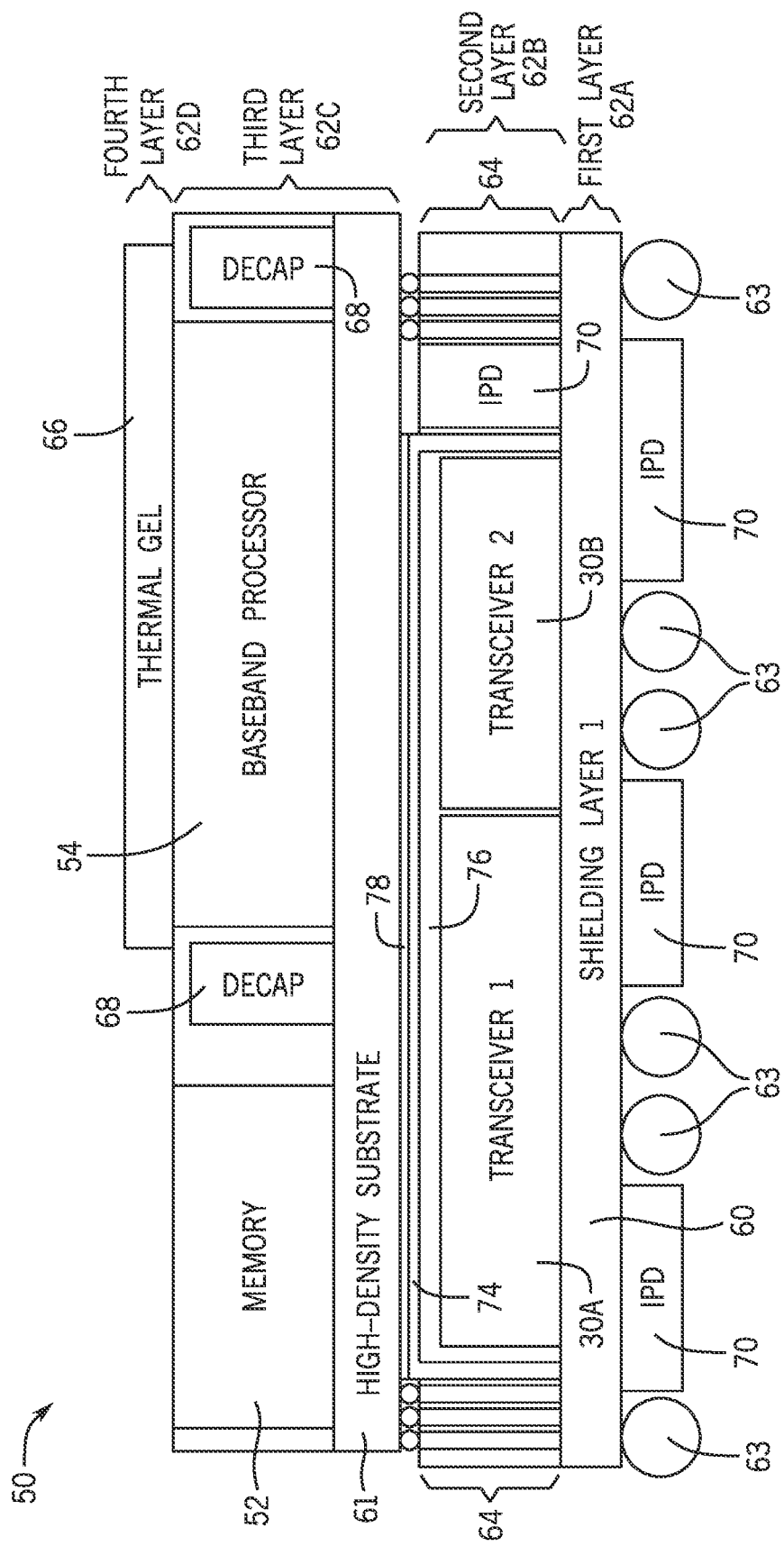
FIG. 12 is a schematic diagram of a radio frequency system package with the trench shielding and ferrite powder shielding, according to embodiments of the present disclosure.

Additionally or alternatively to the trenches 74 with conformal shielding material and/or the through mold vias 64 for providing shielding, the radio frequency system package 50 may include ferrite powder 78 or the like, as shown in FIG. 12. For example, additionally or alternatively to the ferrite powder 78, the radio frequency system package 50 may include an electromagnetic interference (EMI) absorber (e.g., EMI absorber film). In the depicted embodiment, a layer of ferrite powder 78 may be placed above a trench 74 of the conformal shielding. In some embodiments, a gap or space between components and chips may be included. In the current embodiment, the transceivers 30 may be positioned at a distance from the high-density substrate 61, forming a gap or a space between the transceivers 30 and the high-density substrate 61. Rather than filling the entire gap with mold, trenches 74 with conformal shielding and/or a layer of ferrite powder 78 may be used to fill at least a portion of the gap and provide shielding. In some embodiments, the trenches 74 may vary in depth (e.g., deeper for more conformal shielding material when there is a large gap). In some embodiments, using trenches 74 and/or the ferrite powder 78 may be based on a threshold dimension of the gap. By way of example, in the depicted embodiment, the gap may be approximately 50 to 70 μm deep along the z-axis 29 while the conformal shielding of the trench 74 is approximately 5 to 10 μm deep. As such, a layer of ferrite powder 78 may be added to the conformal shielding to fill in the gap and provide shielding. Although the depicted embodiment shows the ferrite powder 78 placed on top of the trench 74, which represents a particular embodiment, the ferrite powder 78 may be placed elsewhere around the components of the radio frequency system package 50, such as to also form continuous shielding (e.g., similar placement as the trenches 74 with the conformal shielding materials). The ferrite powder 78 may include EMI shielding materials, such as iron oxide blended with one or more metallic elements. The metallic elements may include strontium, barium, manganese, nickel, zinc, and the like.

The combination of the trench 74 filled with conformal shielding and the layer of ferrite powder 78 may provide shielding from noise over a broad range of frequencies. In particular, the conformal shielding material may shield from interference occurring over high frequencies while the ferrite powder 78 may shield from interference occurring at low frequencies. For example, the ferrite powder 78 shields from noise traveling at low frequencies while being permeable (e.g., enabling to pass through) at high frequencies. Thus, noise may be attenuated or substantially may not travel from the third layers 62C with the baseband processor 54 to the second layer 62B with the transceivers 30, which may be relatively more sensitive to noise than the baseband processor 54 or other components of the radio frequency system package 50. As such, the trenches 74 filled with conformal shielding and layers of ferrite powder 78 may provide signal integrity and noise immunity for the chips of the radio frequency system package 50.

Figure 13:
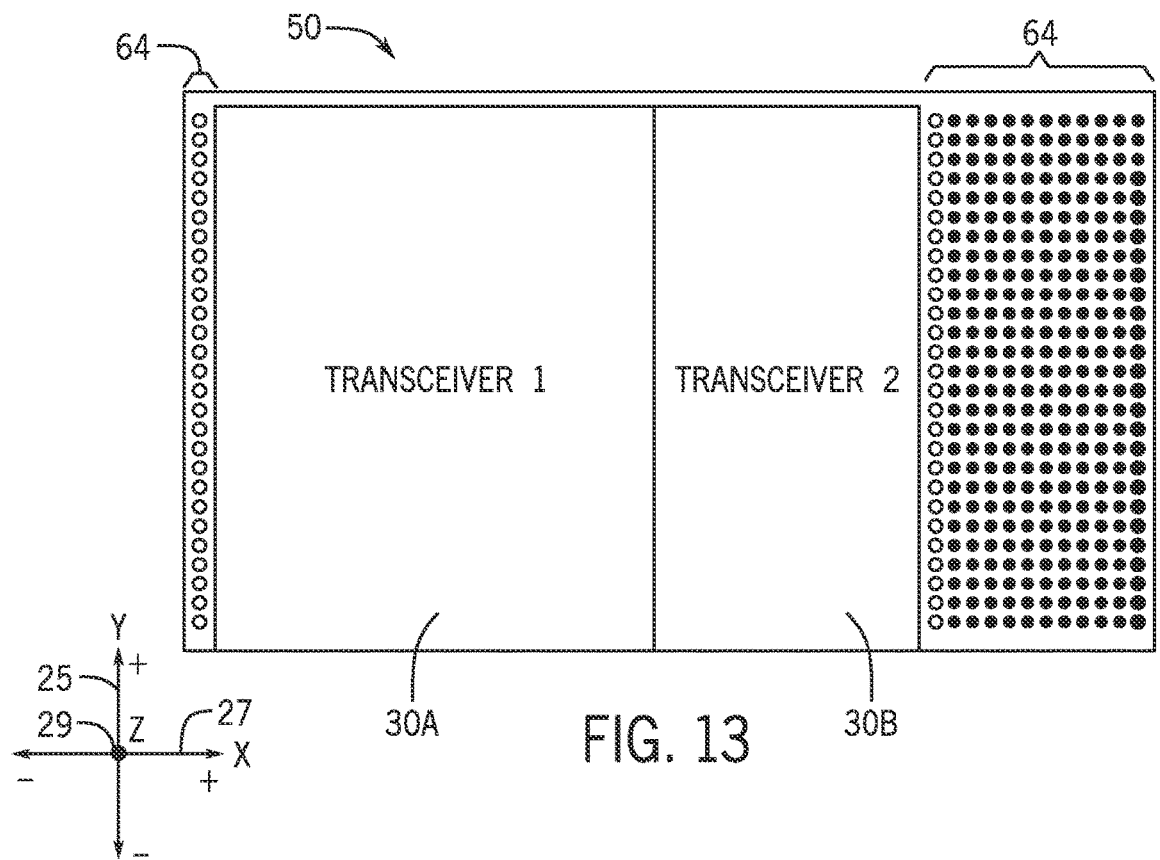
FIG. 13 is a top view diagram of a bottom layer of a radio frequency system package with through mold vias, according to embodiments of the present disclosure.
Figure 14:
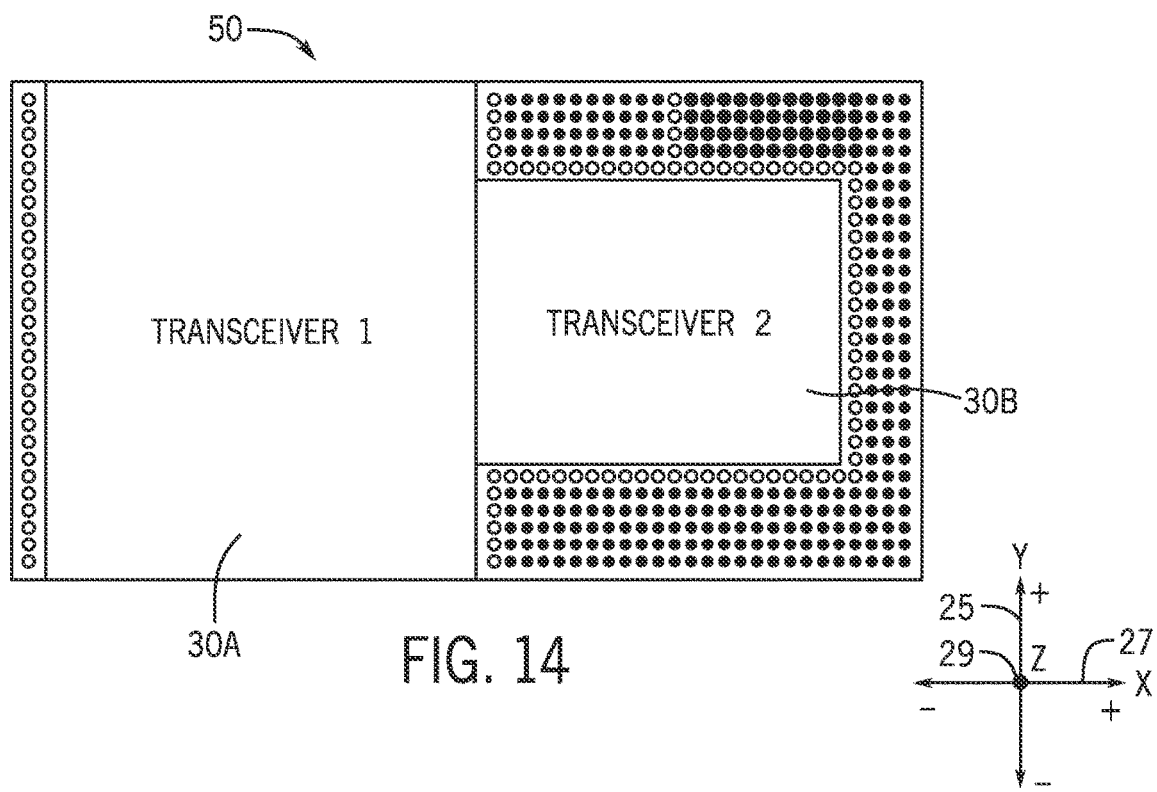
FIG. 14 is another top view diagram of a bottom layer of a radio frequency system package with through mold vias, according to embodiments of the present disclosure.

FIG. 13 is a top view diagram of a bottom layer of the radio frequency system package 50 of the electronic device of FIG. 8 with through mold vias 64. The bottom layer (e.g., the second layer 62B of FIG. 12) may include the first transceiver 30A and the second transceiver 30B. As shown in FIG. 13, the transceivers 30 may be of the same or approximately similar dimensions, such that the horizontal side along the x-axis 27, the vertical side along the y-axis 25, or both, of the transceivers 30 line up. On the other hand, and as shown in FIG. 14, the dimensions may be different, such that the horizontal side, the vertical side, or both, of the transceiver 30 do not line up when placed adjacently. In both FIG. 13 and FIG. 14, the transceiver 30 are surrounded by through mold vias 64. Although the following descriptions describe a particular number of rows and a particular number of columns of the through mold vias 64, which represents particular embodiments, the radio frequency system package 50 may include one or more rows, one or more columns, or both, with one or more through mold vias 64 (e.g., more rows and columns correspond to more shielding). Additionally, although the following descriptions describe the through mold vias 64 including a particular number of the through mold vias 64 as including shielding material or providing signal routing, which represents particular embodiments, the radio frequency system package 50 may include any number of the through mold vias 64 as including shielding material, providing signal routing, or both.

For example, the through mold vias 64 may generally provide signal routing between layers 62 of the radio frequency system package 50, provide shielding, or both. Furthermore, although the through mold vias 64 are positioned along the sides of the transceivers 30 along the y-axis 25, which represents a particular embodiment in which the top and bottom sides along the x-axis 27 are not exposed (e.g., due to other substrates, chips, and so forth in the stacked radio frequency system package 50), the transceivers 30 may be fully surrounded by or enclosed by the through mold vias 64 if the particular sides are exposed.

As shown in both FIG. 13 and FIG. 14, the transceivers 30 may be surrounded by through mold vias 64 (indicated by the unfilled circles) that provide shielding and are grounded. The through mold vias 64 that provide shielding may be surrounded by through mold vias 64 that route signals (indicated by filled circles). The spatial arrangement of through mold vias 64 providing shielding and grounding and the through mold vias 64 providing routing may be based on the function provided by the respective through mold vias 64. By way of example, the through mold vias 64 providing shielding may connect to analog ground and not digital ground and may be arranged accordingly.

The arrangement of the through mold vias 64 for shielding and the through mold vias 64 for routing signals may be based on a predetermined level of intended shielding and/or for particular frequencies, destination of the signals, signals paths, and other system package related features. Although the following descriptions describe the through mold vias 64 used for either shielding or routing signals, which represents a particular embodiment, the radio frequency system package 50 may include through mold vias 64 that provide shielding as well as route signals.

As shown, the through mold vias 64 around the transceivers 30 are of high-density (e.g., many through mold vias 64 per area). For example, the through mold vias 64 may be placed in close proximity to each other, effectively forming a shielding enclosure or a faraday cage for the transceivers 30 (e.g., within a threshold distance to provide shielding function of the faraday cage). For example, the density may provide equal to or less than a 0.25 millimeter (mm) pitch (e.g., center to center distance between two through molds vias 64 is less than 0.25 mm). The outer through mold vias 64 (e.g., outside the shielding through mold vias 64) may route signals, such as from the transceivers 30 to the baseband processor 54 (e.g., from the bottom floor to a top floor of the radio frequency system package 50, along the positive z-axis 29 of FIG. 12). Additionally, the frequency shielding provided by the depicted faraday cages of FIG. 13 and FIG. 14 may provide shielding in a frequency range of up to approximately 40-80 gigahertz (GHz) (e.g., 40 GHz).

Figure 15:
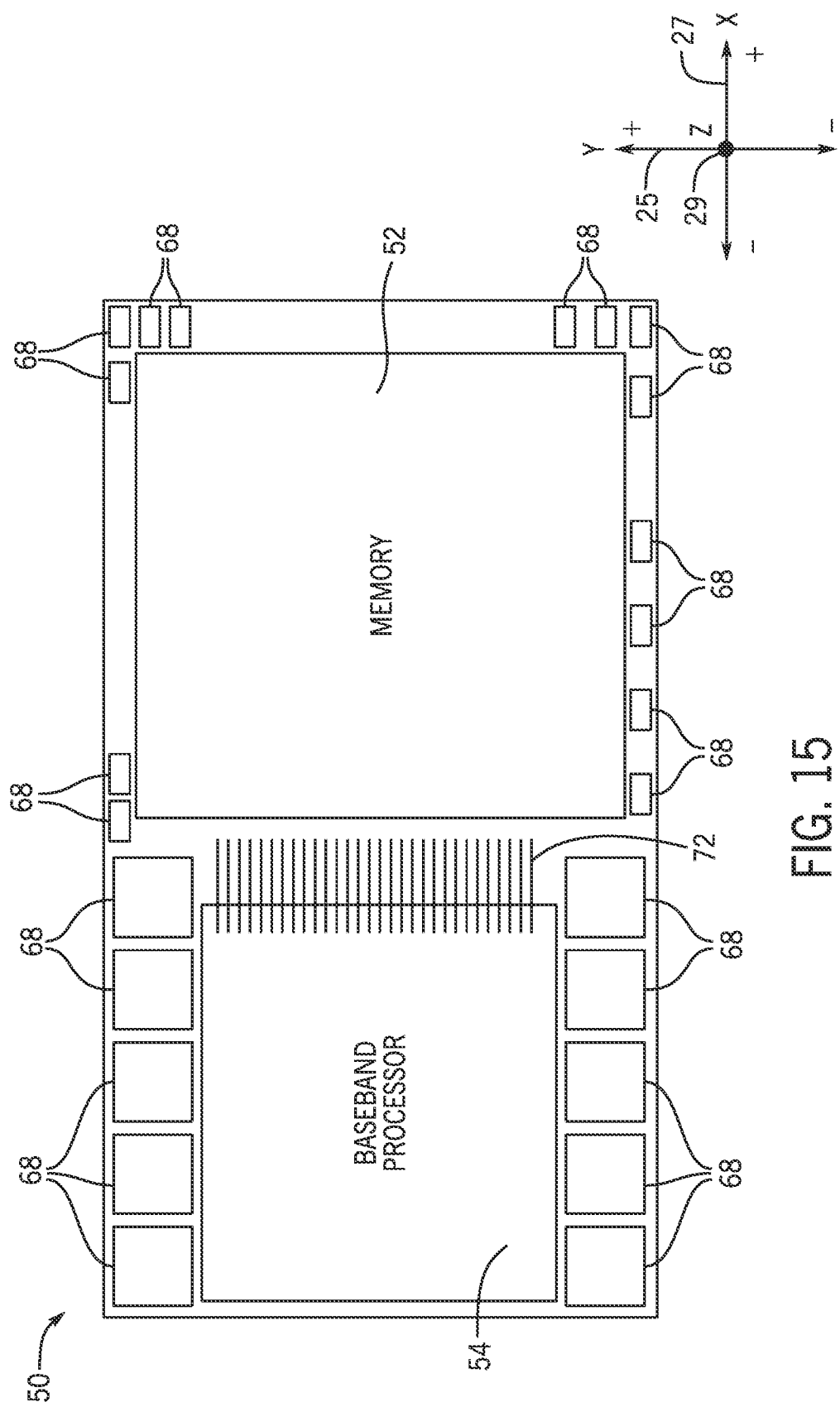
FIG. 15 is a top view diagram of a top layer of a radio frequency system package, according to embodiments of the present disclosure.

FIG. 15 is a top view diagram of a top layer (e.g., third layer 62C of FIG. 12) of a radio frequency system package 50. The memory 52 may include one or more banks or rows of event data record (EDR) memory or the like. In general, the memory 52 may use approximately 5-10 gigabits (GB) (e.g., 8 GB) of memory to process the incoming signals. The radio frequency system package 50 may include one or more decoupling capacitors 68 (e.g., varying in size and/or capacitor values) that are placed around the exposed side or areas of the baseband processor 54 and the memory 52. The decoupling capacitors 68 may function as previously described (e.g., provide a decoupling network).

By way of example, the area including the memory 52 and the baseband processor 54 may have a height of approximately 5 to 10 millimeters (mm) along the y-axis 25 and a width of approximately 10 to 15 mm along the x-axis 27 (e.g., 7 mm by 13 mm, 5 mm by 10 mm, and so forth). The baseband processor 54 may have a height and width of approximately 5 to 7 mm (e.g., 6 mm×6 mm, 6.1 mm×6.4 mm, and so forth). The memory 52 chip may have a height and width of approximately 3 to 5 mm (e.g., 4.4 mm×3.1 mm, 5.14 mm×4.6 mm, 5.2 mm×5.0 mm, and so forth). By way of another example, the memory 52 and the baseband processor 54 may have depths along the z-axis 29 of approximately 0.5 to 1.0 mm (e.g., 0.7 mm, 0.8 mm, 0.9 mm, and so forth).

The baseband processor 54 and the memory 52 may be connected or coupled using wire bonds 72 (as shown), chip-to-chip connections, or both. In some embodiments, the baseband processor 54 and the memory 52 may be indirectly electrically and/or communicatively coupled using an intermediate routing structure such as an interposer, communication bar or logic bar, with direct connections between the routing structure and the baseband processor 54 and direct connections between the routing structure and the memory 52. The wire bonds 72 and/or the chip-to-chip connections may send data between the memory 52 and the baseband processor 54 (e.g., send data from the memory 52 to the baseband processor 54). In some embodiments, the wire bonds 72 may be replaced to remove any possible latency issues, high bandwidth issues, and so forth, otherwise occurring with the wire bonds 72. In the chip-to-chip embodiments, the chip-to-chip connection between the baseband processor 54 and the memory 52 may involve high speed serial links for communicating.

Figure 16:
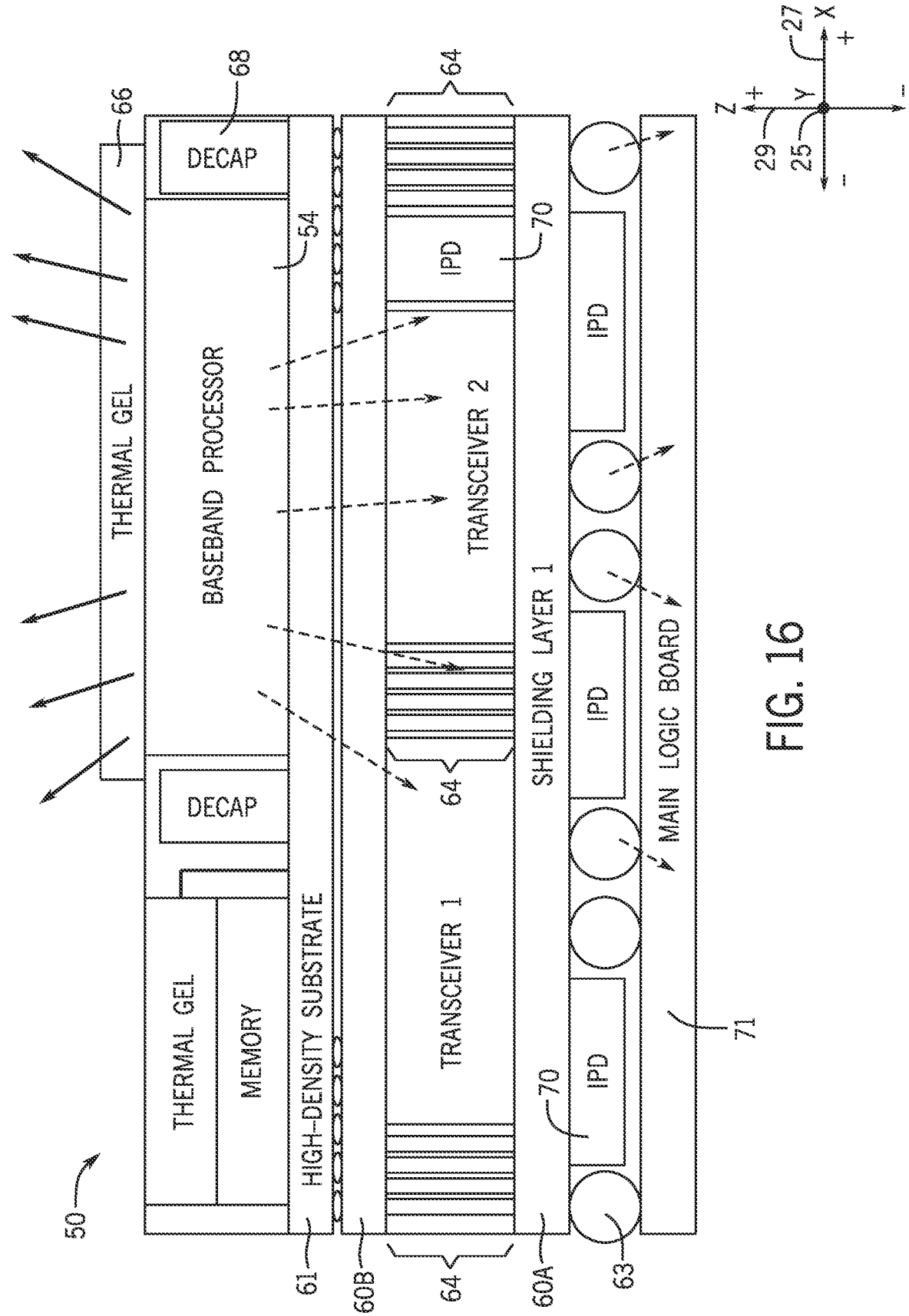
FIG. 16 is a schematic diagram of a radio frequency system package with thermal paths, according to embodiments of the present disclosure.

FIG. 16 is a schematic diagram of a radio frequency system package 50 with thermal paths. The radio frequency system package 50 may consume more power by stacking the memory 52 and the baseband processor 54 on top of the transceivers 30 within the radio frequency system package 50, in a smaller x-axis 27 and y-axis 25 area. The large power consumption may generate heat and the baseband processor 54 may consume most of the generated heat. In one embodiment, the top side of the baseband processor 54 along the positive z-axis 29 may be exposed to dissipate the heat from the baseband processor 54 and the radio frequency system package 50. In additional or alternative embodiments, and as shown, the top side of the baseband processor 54 may include the thermal gel 66. Moreover, in additional or alternative embodiments, the top side of the baseband processor 54 may include a heat spreader (e.g., a graphite head spreader), a dummy chip, or both to dissipate the heat. As shown by the solid line arrows, the heat may dissipate from the baseband processor 54 using these techniques, such as towards and through the thermal gel 66 (e.g., the heat removing technique). The exposed top, the thermal gel 66, the dummy chip, and/or the heat spreader, may form a continuous heat spreader to remove the heat from the baseband processor 54.

In some embodiments, and as indicated by the dashed line arrows, heat generated from the baseband processor 54 may also travel in various directions, such as down into the bottom floors along a negative z-axis 29. The heat may impact the transceiver 30, as well as a main logic board 71 connected to the radio frequency system package 50. For example, cross heating may occur in the radio frequency system package 50. The through mold vias 64 may absorb or dissipate the heat. In particular, the through mold vias 64 may be made of heat dissipating materials, such as copper. As such, the through mold vias 64 discussed herein may provide signal filtering, reduce noise by providing shielding, and also transfer heat out of the radio frequency system package 50 (e.g., function as a heat conduit for transferring heat). In particular, the amount of metal for the through mold vias 64 may correspond to the amount of shielding and heat removal (e.g., greater amount of metal corresponds to more shielding and greater amount of heat removed).

Figure 17:
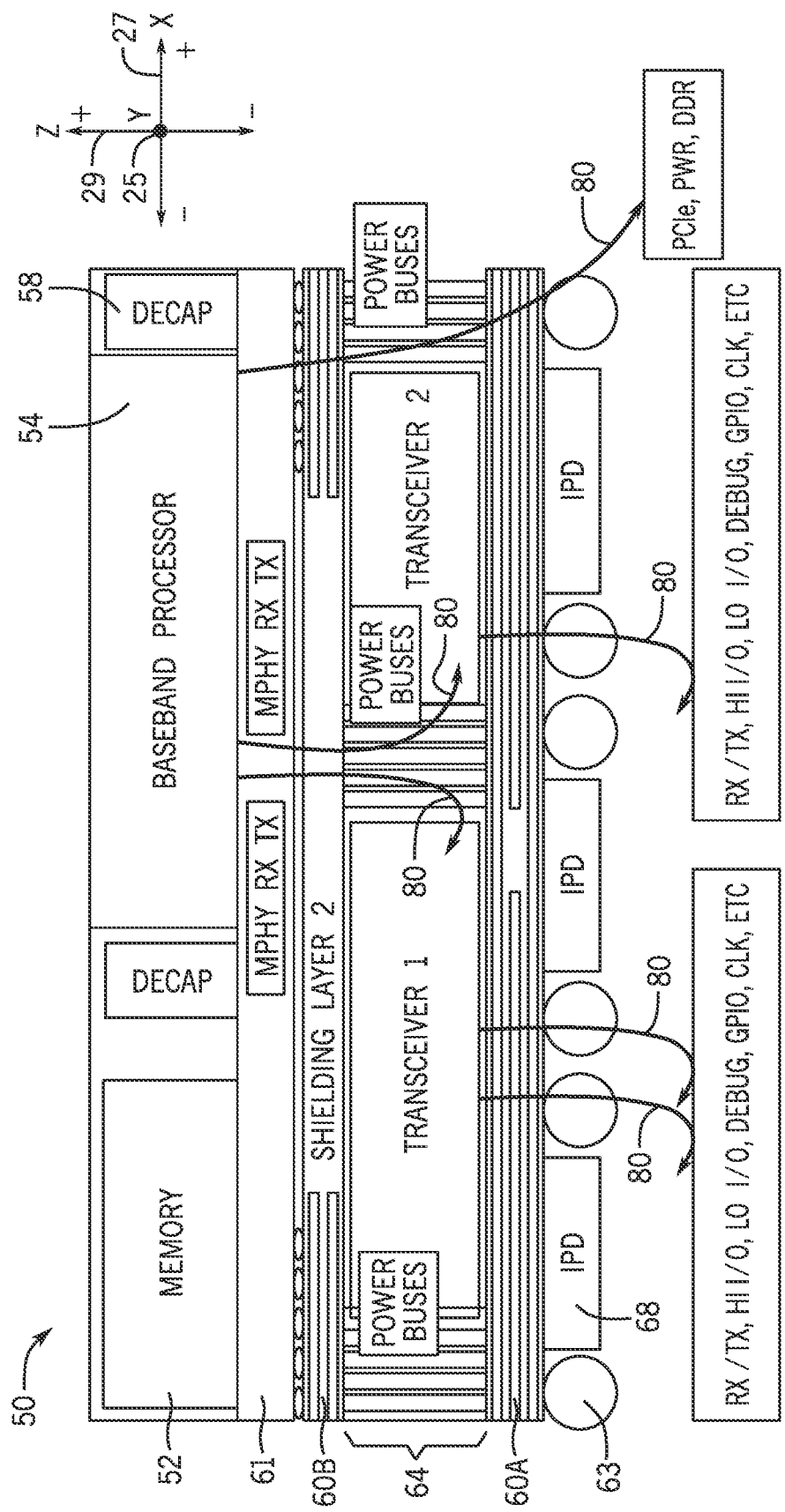
FIG. 17 is a schematic diagram of signal communication paths within a radio frequency system package, according to embodiments of the present disclosure.

FIG. 17 is a schematic diagram of signal communication and signal paths 80 within a radio frequency system package 50. As indicated by the arrows, the signal paths 80 may include a signal flow from the baseband processor 54 down along the negative z-axis 29 to the transceivers 30, and from the transceivers 30 to the printed circuit board (e.g., main logic board 71, other boards, packages, or components on the printed circuit board). In particular, the signal path 80 from the baseband processor 54 may include transmission related signals and reception related signals communicated using a serial communication protocol. The baseband processor 54 may also communicate peripheral Component Interconnect Express (PCIe) signals, signals related to memory (DDR), and signals related power (PWR) to the printed circuit board (e.g., boards, packages, or components on the printed circuit board). In some embodiments, power signals may be communicated through the through mold vias 64 that may function as power buses. As shown, the transceivers 30 may send high speed input/output (I/O) signals, low speed input/output signals (I/O), general-purpose input/output (GPIO) signals, debug signals (Debug), clock signals (CLK), and the like. In some embodiments, the transceivers 30 may communicate a different number of signals, different types of signals, and/or at different speeds. By way of example, the first transceiver 30A may communicate 30 to 50 signals simultaneously (e.g., indicated by the two arrows from the first transceiver 30A) while the second transceiver 30B communicates 10 to 20 signals simultaneously (e.g., indicated by the single arrow from the second transceiver 30B). As such, the signals may be communicated in a top-down manner within the radio frequency system package 50. In additional or alternative embodiments, at least some of the signals may be communicated laterally, in a bottom-up manner along the signal paths 80 (e.g., from the printed circuit board to transceivers 30, from the transceivers 30 to the baseband processor 54, and so forth), or both.

Figure 18:
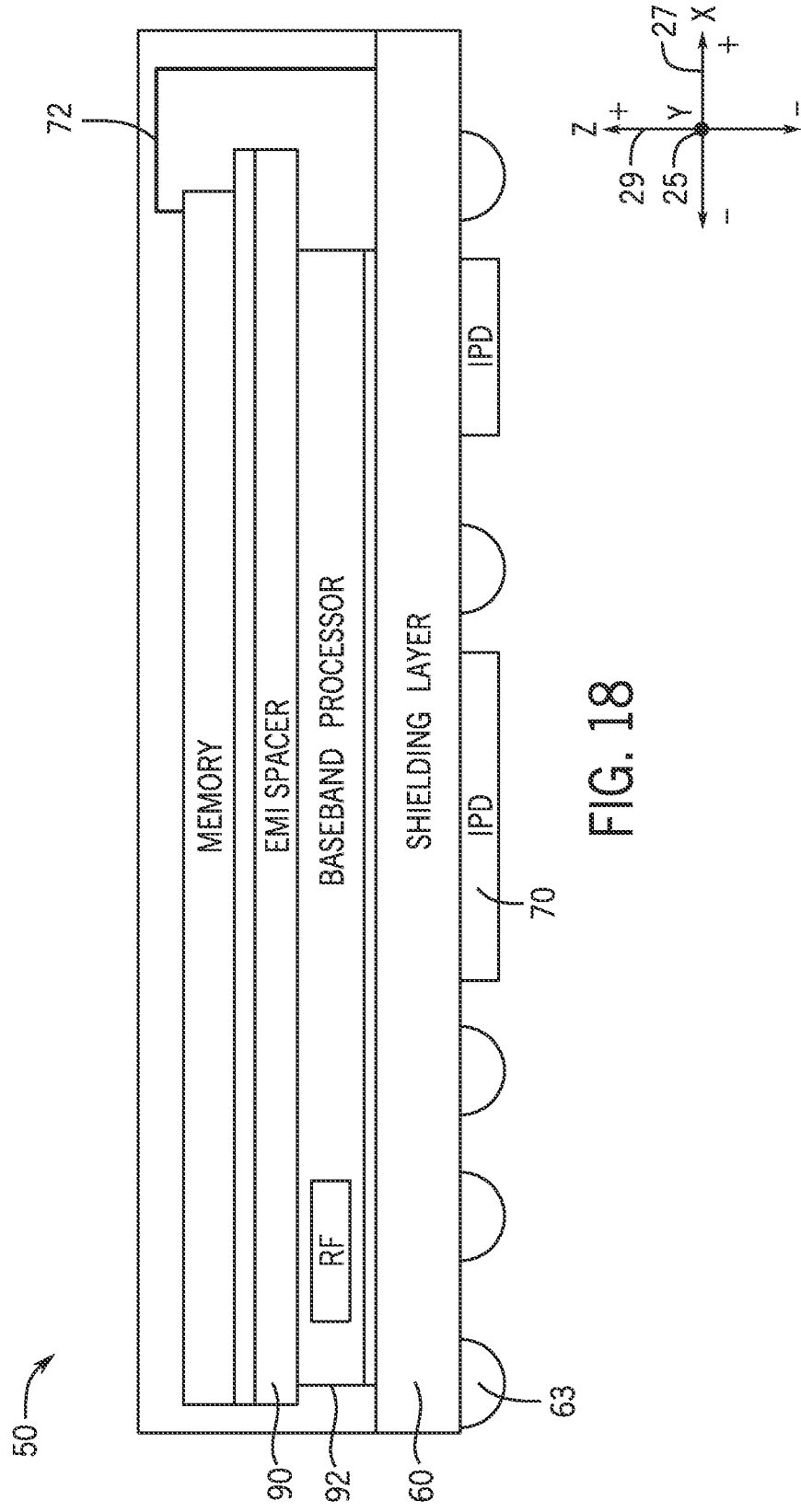
FIG. 18 is a schematic diagram of a radio frequency system package with an electromagnetic interference spacer, according to embodiments of the present disclosure.

FIG. 18 is a schematic diagram of a radio frequency system package 50 with an electromagnetic interference (EMI) spacer 90. In some embodiments, to conserve space along the x-axis 27, the y-axis 25, or both, the memory 52 may be stacked on top of the baseband processor 54 rather than placed adjacently. By way of example, the radio frequency system package 50 may be included in the wearable electronic device 10E of FIG. 6. Generally, the wearable electronic device 10E may not communicate over a broad range of frequencies (e.g., limited to GPS, Wi-Fi, a few cellular frequencies, and so forth) and as such, the transceiver 30 may be smaller than a radio frequency system package 50 of other devices that communicate over a broader range of frequencies, such as the handheld device 10B of FIG. 3. Moreover, the dimensions of the wearable electronic device 10E may be relatively small and thus, may utilize the radio frequency system package 50 conserving space along the x-axis 27 and the y-axis 25 by stacking the memory 52 on top of the baseband processor 54. However, this stacked structure may be used for any suitable radio frequency devices (e.g., devices 10A-10E).

In some embodiments, and as shown, the baseband processor 54 may be integrated with or couple to a radio frequency chip 92 (e.g., chip with baseband processing and radio frequency functions combined). The radio frequency chip 92 may perform similar functions to the transceivers 30 described herein. The memory 52 may communicate with the baseband processor 54 using serial communication protocol (e.g., sending data one bit at a time, sequentially, over a communication channel), as well as use differential links for communicating with the baseband processor 54 integrated with the radio frequency chip 92. In some instances, noise from the baseband processor 54 may negatively impact signal integrity from the memory 52 and noise from the memory 52 may negatively impact signal integrity from the baseband processor 54. In particular, since the memory 52 is stacked on top of the baseband processor 54, the memory 52 may be relatively larger along the x-axis 27, the y-axis 25, or both (e.g., approximately the same as the baseband processor 54), rather than along the z-axis 29 to fit inside a small package (e.g., not too tall for a wearable device 10E). In such embodiments, the semiconducting substrate of the memory 52 may generate noise that leaks into the radio frequency chip 92 of the baseband processor 54, causing signal degradation of radio frequency signals. To reduce the impact of the leaked noise, the radio frequency system package 50 includes the electromagnetic interference spacer 90 between the memory 52 and the baseband processor 54. The electromagnetic interference spacer 90 may include a substrate of shielding material that provides shielding across a range of frequencies used for communication by the radio frequency system package 50. Furthermore, the radio frequency system package 50 may include wire bonds 72 to ground the radio frequency system package 50. As shown, the wire bonds 72 may interconnect the memory 52, the electromagnetic interference spacer 90, and the shielding layer 60, effectively providing a shielding enclosure (e.g., a faraday cage).

Figure 19:
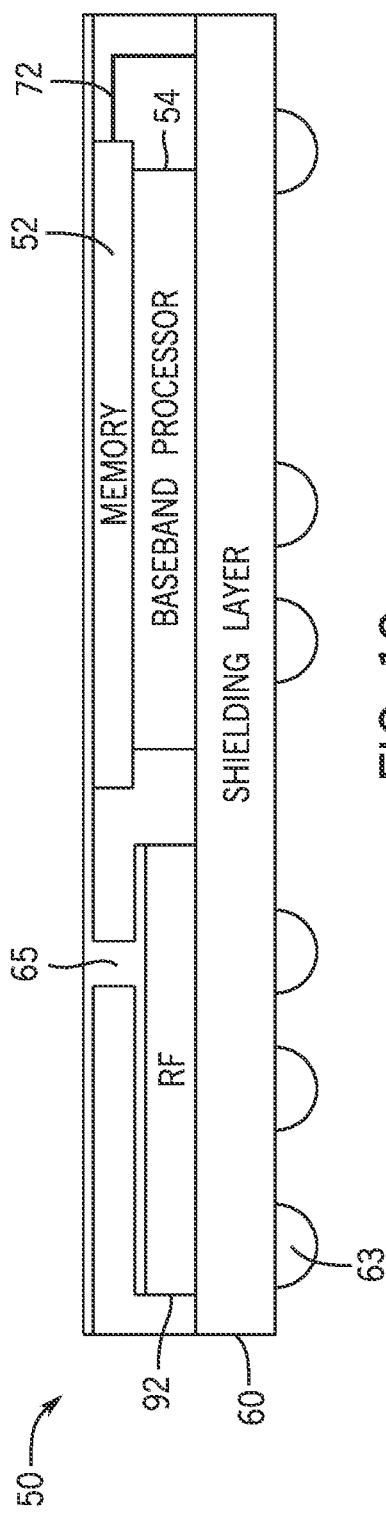
FIG. 19 is a schematic diagram of a radio frequency system package with a partial through mold via, according to embodiments of the present disclosure.

FIG. 19 is a schematic diagram of a radio frequency system package 50 with a partial through mold via 65. The partial through mold via 65 may provide similar functions as the through mold vias 64. To form the partial through mold via 64, metal may be sputtered into the partial through mold via 65 and connected to shielding of one or more of the chips. For example, the partial through mold via 65 may connect to wire bonds 72, which connect to a shielding layer 60 (e.g., the first shielding layer 60A and the second shielding layer 60B). As such, the radio frequency system package 50 described herein may be shielded on each side of the package using trenches 74 with conformal shielding, ferrite powder 78, partial through mold vias 65, wire bonds 72 connecting to ground, and so forth.

In some embodiments, the wire bonds 72 may connect to the top of the package (e.g., top side of the memory 52), which may further connect to other components (e.g., the partial through mold via 65). The process for using the wire bonds 72 for shielding may involve grinding down polished metal wires so that the raw metal is exposed and connecting the exposed metal wires to a shield (e.g., shielding substrate). For example, and as shown, the wire bonds 72 may connect the memory 52 to the shielding layer 60 to provide shielding for the memory 52. Thus, the wire bonds 72 may provide interconnections, shielding for the radio frequency system package 50, or both (e.g., interconnecting shielding). In this manner, the partial through mold via 65 and the wire bonds 72 may shield the radio frequency chip 92 from noise generated from the baseband processor 54, the memory 52, or both.

Figure 20:
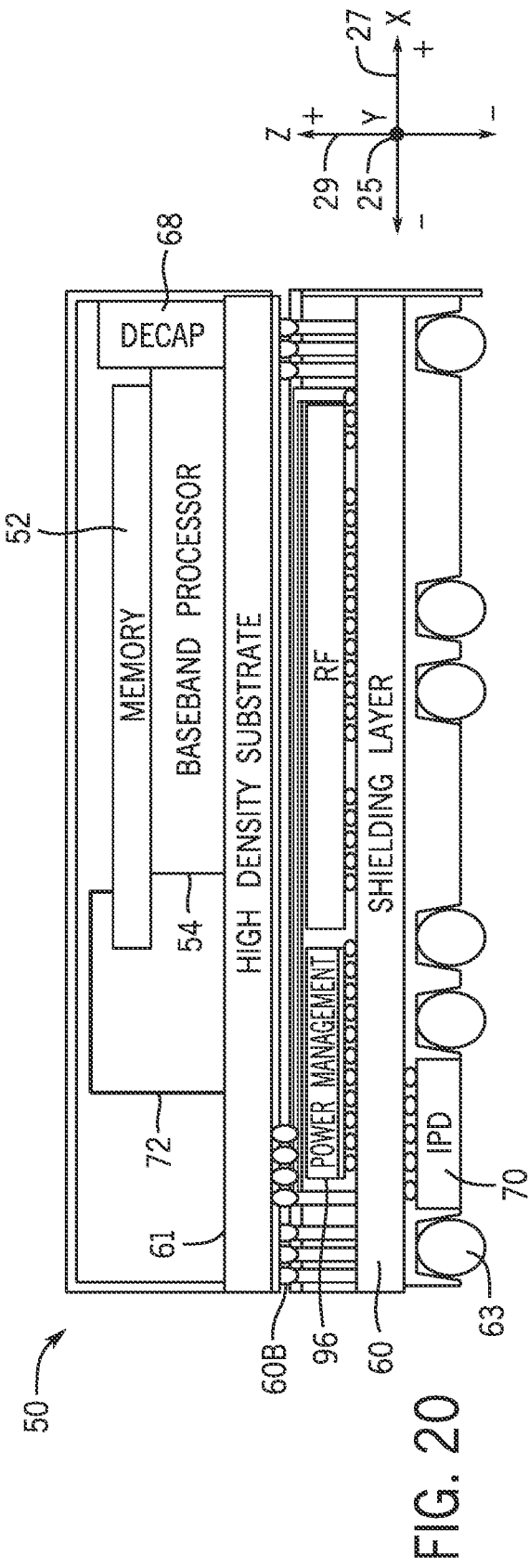
FIG. 20 is a schematic diagram of a radio frequency system package with a wire bonded memory, according to embodiments of the present disclosure.

FIG. 20 is a schematic diagram of a radio frequency system package 50 with a wire bonded memory 52. In some embodiments and as shown, the memory 52 may be stacked on top of the baseband processor 54 rather than adjacently, for example, to conserve area along the x-axis 27 and the y-axis 25. The radio frequency system package 50 may include a power management circuitry 96 (e.g., an integrated circuit on a chip or a power management package). The power management circuitry 96 may control functions related to power for transmitting the transmission signals and receiving the reception signals. The power management circuitry 96 couples (e.g., communicatively or indirectly via interconnects) to the radio frequency chip 92.

As shown, the memory 52 may connect to the high-density substrate 61 via wire bonds 72. The high-density substrate 61 may include laminate-based, organic-based, or both, shielding materials. This wire bonding may reduce or prevent noise from the memory 52, the baseband processor 54, or both, from traveling to and impacting components on the bottom floor of the radio frequency system package, such as the radio frequency chip 92, the power management circuitry 96, or both. The shielding layer 60 and the through mold vias 64 may provide additional shielding within the radio frequency system package 50. The shielding layer 60 may include one or more metal layers (e.g., copper metal layer), as previously discussed.

Figure 21:
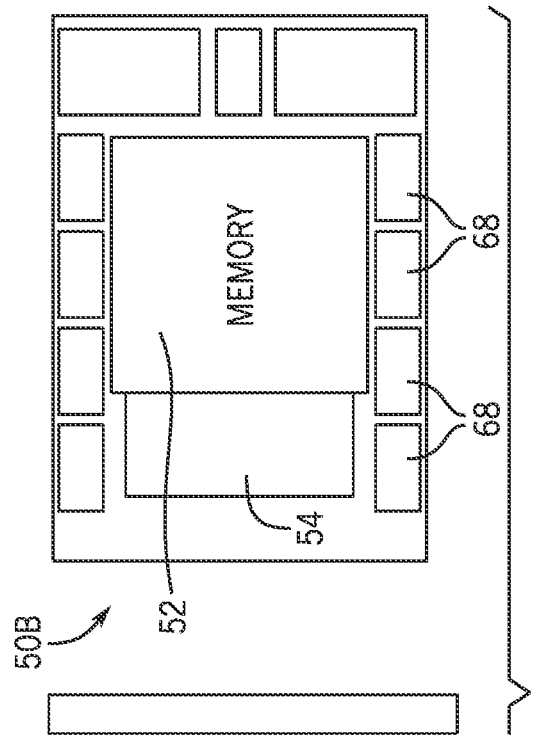
FIG. 21 is a top view diagram of a top layer of a radio frequency system package with decoupling capacitors, according to embodiments of the present disclosure.
Figure 21:
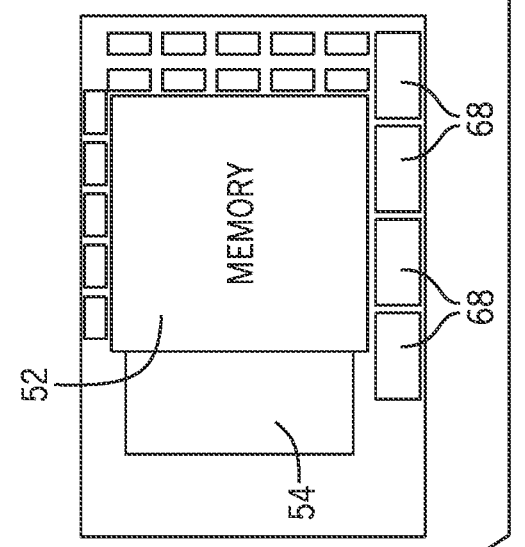

FIG. 21 is a top view diagram of a top layer of a radio frequency system package 50 with decoupling components, such as decoupling capacitors 68. As shown, the memory 52 is placed on top of the baseband processor 54 of the first radio frequency system package 50A and the second radio frequency system package 50B. Additionally, wire bonds 72 attached to the memory 52 may connect to other parts of the radio frequency system packages 50A, 50B, such as on lower layers of the radio frequency system packages 50A, 50B (not shown in the top view). The radio frequency system packages 50A, 50B may include decoupling capacitors 68 around the memory 52, the baseband processor 54, or both. The decoupling capacitors 68 may decouple noise and provide filtering, as previously discussed. The decoupling capacitors 68 of the first radio frequency system package 50A may be relatively smaller than the decoupling capacitors 68 of the second radio frequency system package 50B. The size of the decoupling capacitors 68 may be based on the dimensions of the top floor, the memory 52, the baseband processor 54, or both. In some embodiments, the top floor of the first radio frequency system package 50A may include a length along the y-axis 25 and a width along the x-axis 27 of approximately 3 mm to 7 mm. By way of example, the top floor of the first radio frequency system package 50A may be 6 mm×4 mm while the top floor of the second radio frequency system package 50B may be 6.3 mm×4.3 mm.

Figure 22:
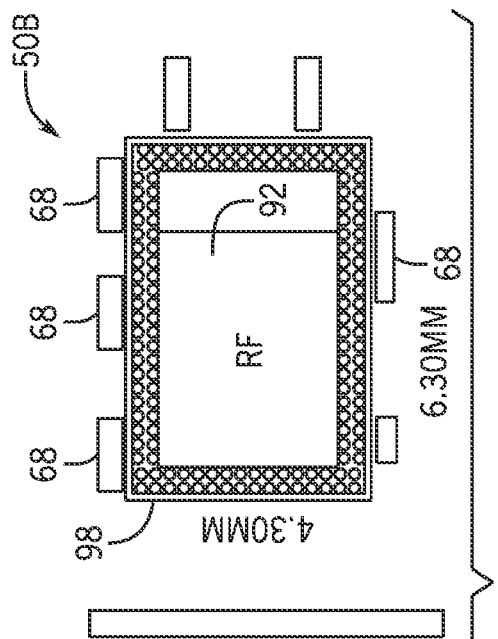
FIG. 22 is another top view diagram of a bottom layer of a radio frequency system package with a ferrite enclosure, according to embodiments of the present disclosure.
Figure 22:
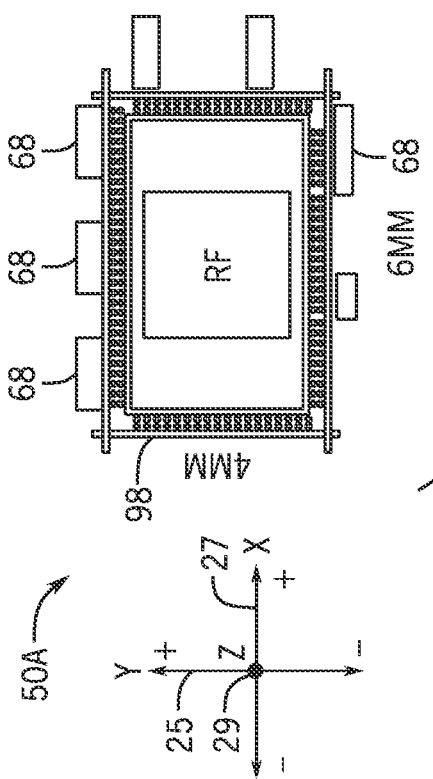

FIG. 22 is a top view diagram of a bottom layer of a radio frequency system package 50 with a ferrite enclosure 98. As shown, the bottom layer of the first and the second radio frequency system packages 50A, 50B may include the radio frequency chip 92. The radio frequency chip 92 may be enclosed with through mold vias 64 around the radio frequency chip 92. The through mold vias 64 may function as described with respect to FIG. 13 and FIG. 14. The radio frequency system packages 50 may also include decoupling capacitors 68 around the through mold vias 64. The decoupling capacitors 68 may decouple noise and provide filtering, as previously discussed. The size of the decoupling capacitors 68 may be based on the dimensions of the bottom layer, the radio frequency chip 92, or both. In some embodiments, the bottom layer of the first radio frequency system package 50A may include a length along the y-axis 25 and a width along the x-axis 27 of approximately 3 mm to 7 mm. By way of example, the bottom layer of the first radio frequency system package 50A may be 6 mm×4 mm while the top floor of the second radio frequency system package 50B may be 6.3 mm×4.3 mm. As such, the techniques described herein facilitate wireless communication over a broad range of frequencies while conserving space in a radio frequency package, managing thermal dissipation, ensuring signal integrity, and providing noise immunity by shielding.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A radio frequency package, comprising:
    a baseband processor configured to perform processing for wireless communication functions;
    a transceiver configured to transmit and receive wireless signals based on the processing of the wireless communication functions;
    a plurality of through mold vias; and
    a memory associated with the baseband processor, the memory configured to store instructions for performing the processing, wherein the memory and the baseband processor are laterally adjacent in a same layer of the radio frequency package and disposed on top of the transceiver and the plurality of through mold vias in the radio frequency package.

2. The radio frequency package of claim 1, comprising a thermal gel configured to dissipate heat, the thermal gel disposed on top of the memory, the baseband processor, or both.

3. The radio frequency package of claim 1, comprising a dummy die configured to absorb heat, the dummy die disposed on top of the memory, the baseband processor, or both.

4. The radio frequency package of claim 1, wherein a top side of the memory, the baseband processor, or both, is an exposed die.

5. The radio frequency package of claim 1, wherein the transceiver is disposed between a first redistribution layer and a second redistribution layer, and wherein the first redistribution layer and the second redistribution layer provide signal routing, shielding from noise, or both.

6. The radio frequency package of claim 1, comprising a plurality of decoupling capacitors disposed on either side of the baseband processor, the plurality of decoupling capacitors are wire bonded and configured to filter noise from the baseband processor.

7. The radio frequency package of claim 1, comprising a continuous shielding of conformal shielding disposed around exposed sides of the transceiver.

8. The radio frequency package of claim 1, comprising a semi-continuous shielding around the transceiver, wherein the semi-continuous shielding comprises conformal shielding along at least a first exposed side of the transceiver and at least one through mold via of the plurality of through mold vias along at least a second exposed side of the transceiver.

9. The radio frequency package of claim 1, wherein the plurality of through mold vias are disposed along each exposed side of the baseband processor, the memory, or both.

10. The radio frequency package of claim 9, wherein a first portion of the plurality of through mold vias are disposed relatively closer to the baseband processor, the memory, or both, wherein a second portion of the plurality of through mold vias are disposed relatively further from the baseband processor, the memory, or both, and wherein the first portion is configured to provide shielding from noise and the second portion is configured to route signals.

11. A stacked system package, comprising:
    a first layer comprising a shielding layer configured to absorb electromagnetic waves;
    a second layer disposed on top of the first layer, the second layer comprising:
        a transceiver configured to transmit and receive wireless signals; and
        a plurality of through mold vias configured to route signals, provide shielding, or both;
    a third layer disposed on top of the second layer, the third layer comprising:
        a baseband processor configured to process radio frequency functions; and
        a memory configured to store instructions for performing the process; and
    a fourth layer disposed on top of the third layer, the fourth layer comprising a thermal gel configured to dissipate heat.

12. The stacked system package of claim 11, wherein the baseband processor generates heat that flows from the third layer to the second layer, the first layer, or both.

13. The stacked system package of claim 12, wherein the plurality of through mold vias absorb or dissipate the heat.

14. The stacked system package of claim 11, wherein the third layer comprises passive devices, the passive devices disposed laterally adjacent to the memory and the baseband processor.

15. The stacked system package of claim 11, wherein the plurality of through mold vias are configured to function as power buses.

16. The stacked system package of claim 11, wherein signals flow top-down from the third layer to the second layer, from the second layer to the first layer, or both.

17. A radio frequency package, comprising:
    a baseband chip configured to perform processing for wireless communication functions;
    a radio frequency chip configured to transmit and receive wireless signals based on the processing of the wireless communication functions;
    a memory chip associated with the baseband chip, the memory chip configured to store instructions for performing the processing, wherein the memory chip is disposed on top of the baseband chip, wherein the baseband chip, the radio frequency chip, and the memory chip are disposed in a same mold layer of the radio frequency package; and
    a shielding layer separate from and vertically adjacent to the same mold layer.

18. The radio frequency package of claim 17, wherein the radio frequency chip is integrated with the baseband chip into a single chip.

19. The radio frequency package of claim 18, wherein the memory chip is bonded by a wire to the shielding layer, wherein the wire provides shielding and interconnections within the radio frequency package.

20. The radio frequency package of claim 17, comprising a partial through mold via disposed in the same mold layer of the radio frequency package and configured to shield the radio frequency chip from noise generated from the baseband chip, the memory chip, or both.

* * * * *